US008294495B2

(12) United States Patent
Lee

(10) Patent No.: US 8,294,495 B2
(45) Date of Patent: Oct. 23, 2012

(54) CONSTANT SLOPE RAMP CIRCUITS FOR SAMPLED-DATA CIRCUITS

(75) Inventor: Hae-Seung Lee, Bedford, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 88 days.

(21) Appl. No.: 12/484,489

(22) Filed: Jun. 15, 2009

(65) Prior Publication Data

US 2009/0309635 A1 Dec. 17, 2009

Related U.S. Application Data

(63) Continuation-in-part of application No. 11/488,550, filed on Jul. 18, 2006, now Pat. No. 7,737,732, which is a continuation-in-part of application No. 11/454,275, filed on Jun. 16, 2006, now Pat. No. 7,486,115.

(60) Provisional application No. 60/595,605, filed on Jul. 19, 2005, provisional application No. 60/595,623, filed on Jul. 21, 2005, provisional application No. 60/595,414, filed on Jul. 1, 2005, provisional application No. 60/595,493, filed on Jul. 11, 2005.

(51) Int. Cl.
*H03K 4/06* (2006.01)

(52) U.S. Cl. ......... 327/131; 327/132; 327/134; 327/140

(58) Field of Classification Search .................. 327/131, 327/132, 134, 140
See application file for complete search history.

(56) References Cited

U.S. PATENT DOCUMENTS

| | | | | |
|---|---|---|---|---|
| 3,636,371 | A * | 1/1972 | Quillier | 327/134 |
| 3,878,484 | A | 4/1975 | Hekimian | |
| 4,584,532 | A | 4/1986 | Duehren et al. | |
| 4,585,951 | A | 4/1986 | Wurzburg | |
| 4,800,333 | A | 1/1989 | Milkovic | |
| 4,835,482 | A | 5/1989 | Tamakoshi et al. | |
| 5,103,230 | A | 4/1992 | Kalthoff et al. | |
| 5,159,341 | A | 10/1992 | McCartney et al. | |
| 5,557,241 | A | 9/1996 | Burke | |
| 6,344,767 | B1 | 2/2002 | Cheung et al. | |
| 6,469,561 | B2 | 10/2002 | Pernigotti et al. | |
| 6,608,504 | B2 | 8/2003 | Fujimoto | |
| 6,956,413 | B2 * | 10/2005 | Bailey | 327/131 |
| 7,319,425 | B2 | 1/2008 | Fiorenza et al. | |
| 7,327,331 | B2 * | 2/2008 | Kang et al. | 345/60 |

* cited by examiner

*Primary Examiner* — Kenneth B. Wells
(74) *Attorney, Agent, or Firm* — North Weber & Baugh LLP

(57) ABSTRACT

A circuit includes a level-crossing detector to generate a level-crossing detection signal when an input signal crosses a predetermined voltage level. A first stage set of capacitors is operatively coupled to the level-crossing detector. A ramp circuit is operatively coupled to the set of series-connected capacitors. A second stage set of capacitors is operatively coupled to the first stage set of capacitors and the ramp circuit. The ramp circuit includes a feedback capacitor and a preset switch to provide a linear ramp output.

5 Claims, 33 Drawing Sheets

$\phi_1$
ON
OFF
t
$\phi_2$
ON
OFF
n
n+1
n+2
t
$V_{out}$
t
$V_1$
0
t

ϕ1
ON
OFF
t
ϕ2
ON
OFF
n
n+1
n+2
t
Vout
Vhigh
Vlow
t1
t2
t
V1
0
ϕ3
t1
t2
t
Vzc
ON
OFF
t1
t2

ϕ1
ON
OFF
t
ϕ2
ON
OFF
t
Vout
Vhigh
Vlow
t
t1
t1+td1
t2
t1+td2
V1
0
Vtr
ϕ3
t
Vzc
ON
OFF φ1
ON
OFF
t
φ2
ON
OFF
t
Vout
Vhigh
Vlow
t
t1
t1+td1
t2
t1+td2
V1
0
Vtr
φ3
t
Vzc
ON
OFF

CONSTANT SLOPE RAMP CIRCUITS FOR SAMPLED-DATA CIRCUITS

PRIORITY INFORMATION

The present application is a continuation-in-part of U.S. patent application Ser. No. 11/488,550 (now U.S. Pat. No. 7,737,732), filed on Jul. 18, 2006, which said co-pending U.S. patent application Ser. No. 11/488,550, filed on Jul. 18, 2006, is a continuation-in-part of U.S. patent application Ser. No. 11/454,275 (now U.S. Pat. No. 7,486,115), filed on Jun. 16, 2006. The present application claims priority, under 35 U.S.C. §120, from co-pending U.S. patent application Ser. No. 11/488,550, filed on Jul. 18, 2006 and co-pending U.S. patent application Ser. No. 11/454,275, filed on Jun. 16, 2006.

Said U.S. patent application Ser. No. 11/488,550, filed on Jul. 18, 2006 claiming priority, under 35 U.S.C. §119(e), from U.S. Provisional Patent Application Ser. No. 60/595,605, filed on Jul. 19, 2005. Said U.S. patent application Ser. No. 11/488,550, filed on Jul. 18, 2006 also claiming priority, under 35 U.S.C. §119(e), from U.S. Provisional Patent Application Ser. No. 60/595,623, filed on Jul. 21, 2005.

Thus, the present application also claims priority, under 35 U.S.C. §119(e), from U.S. Provisional Patent Application Ser. No. 60/595,605, filed on Jul. 19, 2005, and claims priority, under 35 U.S.C. §119(e), from U.S. Provisional Patent Application Ser. No. 60/595,623, filed on Jul. 21, 2005.

Said U.S. patent application Ser. No. 11/454,275, filed on Jun. 16, 2006 claiming priority, under 35 U.S.C. §119(e), from U.S. Provisional Patent Application Ser. No. 60/595,414, filed on Jul. 1, 2005. Said U.S. patent application Ser. No. 11/454,275, filed on Jun. 16, 2006 also claiming priority, under 35 U.S.C. §119(e), from U.S. Provisional Patent Application Ser. No. 60/595,493, filed on Jul. 11, 2005.

Thus, the present application also claims priority, under 35 U.S.C. §119(e), from U.S. Provisional Patent Application Ser. No. 60/595,414, filed on Jul. 1, 2005, and claims priority, under 35 U.S.C. §119(e), from U.S. Provisional Patent Application Ser. No. 60/595,493, filed on Jul. 11, 2005.

The entire contents of U.S. patent application Ser. No. 11/488,550, filed on Jul. 18, 2006; U.S. patent application Ser. No. 11/488,548, filed on Jul. 18, 2006; U.S. patent application Ser. No. 11/454,275, filed on Jun. 16, 2006; U.S. Provisional Patent Application Ser. No. 60/595,414, filed on Jul. 1, 2005; U.S. Provisional Patent Application Ser. No. 60/595,493, filed on Jul. 11, 2005; U.S. Provisional Patent Application Ser. No. 60/595,605, filed on Jul. 19, 2005; and U.S. Provisional Patent Application Ser. No. 60/595,623, filed on Jul. 21, 2005 are hereby incorporated by reference.

The present application also claims priority, under 35 U.S.C. §119(e), from U.S. Provisional Patent Application Ser. No. 61/061,720, filed on Jun. 16, 2008. The entire content of U.S. Provisional Patent Application Ser. No. 61/061,720, filed on Jun. 16, 2008, is hereby incorporated by reference.

BACKGROUND AND SUMMARY

Most sample-data analog circuits such as switched-capacitor filters, analog-to-digital converters, and delta-sigma modulators require operational amplifiers to process the signal. Consider a switched-capacitor integrator example shown in FIG. 2. First, the switches $S_{11}$ and $S_{13}$ are closed so that the input voltage $v_{in}$ is sampled on the sampling capacitor $C_{S1}$. Next, the switches $S_{11}$ and $S_{13}$ are opened and $S_{12}$ and $S_{14}$ are closed. This operation transfers the charge in the sampling capacitor $C_{S1}$ to the integrating capacitor $C_{I1}$. The output voltage, $v_{out}$, of a first integrator 1100 is typically sampled by another sample-data circuit, for example, another switched-capacitor integrator.

In the circuit shown in FIG. 2, the circuit consisting of switches $S_{21}$, $S_{22}$, $S_{23}$, $S_{24}$, and a second sampling capacitor $C_{S2}$ comprise a part of the second switched-capacitor integrator. The output voltage, $v_{out}$, of the first integrator 10 is sampled on the second sampling capacitor $C_{S2}$ by closing switches $S_{21}$ and $S_{23}$.

An example of a timing diagram is shown in FIG. 3. The clock signal has two non-overlapping phases $\phi_1$ and $\phi_2$. The phase $\phi_1$ is applied to switches $S_{11}$, $S_{13}$, $S_{21}$, and $S_{23}$, and phase $\phi_2$ is applied to switches $S_{12}$, $S_{14}$, $S_{22}$, and $S_{24}$. With this timing, the circuit performs non-inverting discrete integration with full clock delay. The waveforms at the output of the integrator, $v_{out}$, and at the virtual ground node 100, $v_1$, are also shown in FIG. 3. Different clock phasing arrangements yield different responses from the integrator. For example, if $\phi_1$ is applied to switches $S_{11}$, $S_{13}$, $S_{22}$, and $S_{24}$, and phase $\phi_1$ is applied to switches $S_{12}$, $S_{14}$, $S_{21}$, and $S_{23}$, the circuit performs non-inverting integration with half-clock delay.

For an accurate integration of the input signal, $v_1$ must be driven as close to ground as possible. In order to accomplish this, the operational amplifier must provide sufficient open-loop gain and low noise. In addition, for fast operation, the operational amplifier 10 of FIG. 2 must settle fast.

In FIG. 3, the voltage $v_1$ is shown to settle back to ground after a disturbance when the sampling capacitor $C_{S1}$ is switched to Node 100 by closing $S_{12}$ and $S_{14}$. In addition to high open-loop gain and fast settling time, operational amplifiers must provide large output swing for high dynamic range. As the technology scales, it becomes increasingly difficult to achieve these characteristics from operational amplifiers. The primary factors that make the operational amplifier design difficult are low power supply voltages and low device gain.

As noted above, accurate output voltage can be obtained if Node 100 in FIG. 2 is maintained precisely at ground. However, in sample-data circuits, the only point of time accurate output voltage is required is at the instant the output voltage is sampled by another sampling circuit. Thus, it is not necessary to maintain the voltage at Node 100 at ground all the time.

It is further noted that delays in the detectors of sample-data circuits may cause errors in the operation thereof. Moreover, it is noted that performance parameters such as speed, accuracy, and power consumption of sample-data circuits depend upon the design of zero crossing detectors.

Therefore, it is desirable to provide a sample-data circuit that maintains the proper level at the virtual ground node at the instant the output voltage is sampled by another sampling circuit, substantially eliminates the errors caused by delays, and optimizes the performance parameters such as speed, accuracy, and power consumption of the sample-data circuit.

Moreover, it is desirable to provide a sample-data circuit that maintains the proper level at the virtual ground node at the instant the output voltage is sampled by another sampling circuit and provides differential signal paths for sample-data circuits, substantially eliminates the errors caused by delays, and optimizes the performance parameters such as speed, accuracy, and power consumption of the sample-data circuit.

Furthermore, it is desirable to provide a sample-data circuit that reduces the effect of power supply, substrate, and common-mode noise by symmetric differential signal processing, substantially eliminates the errors caused by delays, and optimizes the performance parameters such as speed, accuracy, and power consumption of the sample-data circuit.

Also, it is desirable to provide a sample-data circuit that increases the signal range by incorporating differential signal paths, substantially eliminates the errors caused by delays, and optimizes the performance parameters such as speed, accuracy, and power consumption of the sample-data circuit.

BRIEF DESCRIPTION OF THE DRAWINGS

The drawings are only for purposes of illustrating various embodiments and are not to be construed as limiting, wherein.

DETAILED DESCRIPTION OF THE PRESENT INVENTION

Figure 1:
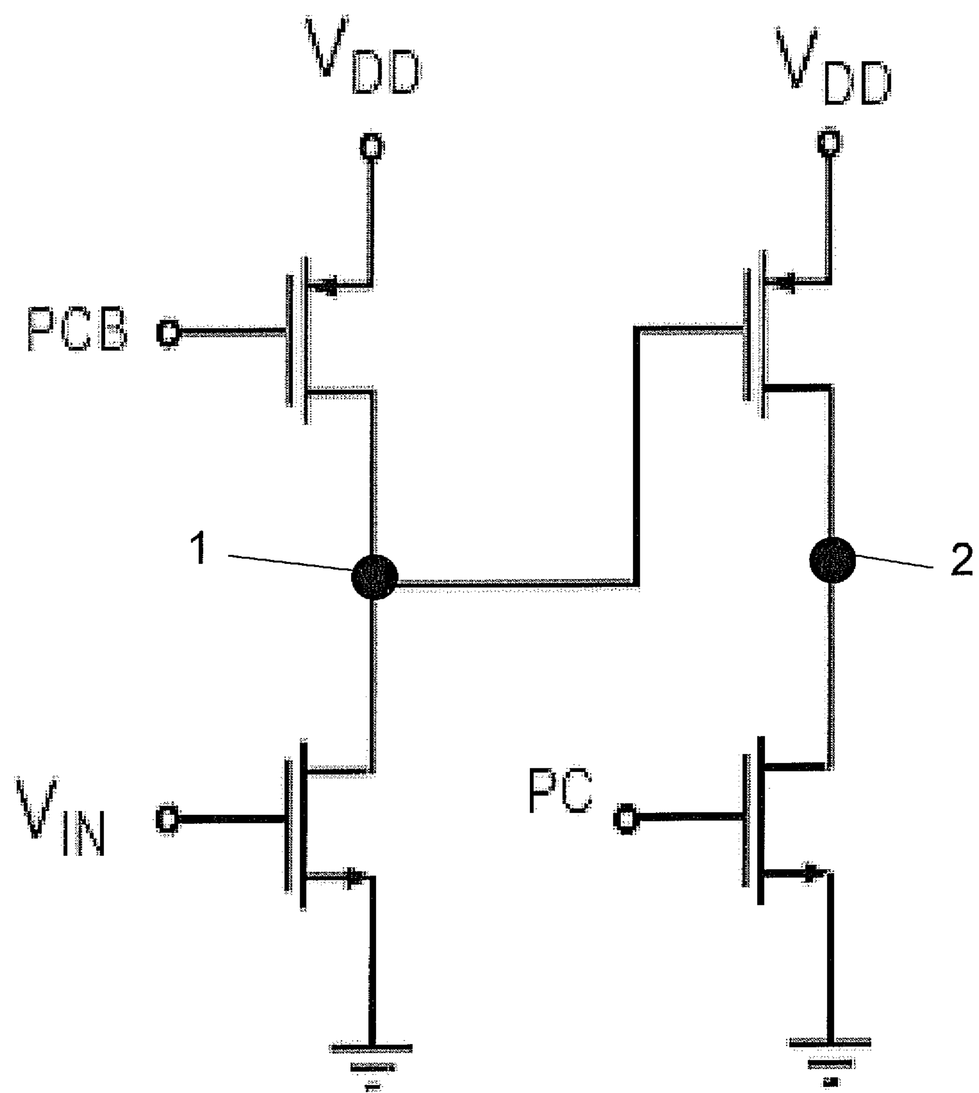
FIG. 1 illustrates a zero-crossing detector.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

It is noted that, in the various Figures, the earth symbol indicates the system's common-mode voltage. For example, in a system with 2.5 V and −2.5 V power supplies, the system's common-mode voltage may be at ground. In a system with a single 2.5 power supply, the system's common-mode voltage may be at 1.25 V.

Figure 2:
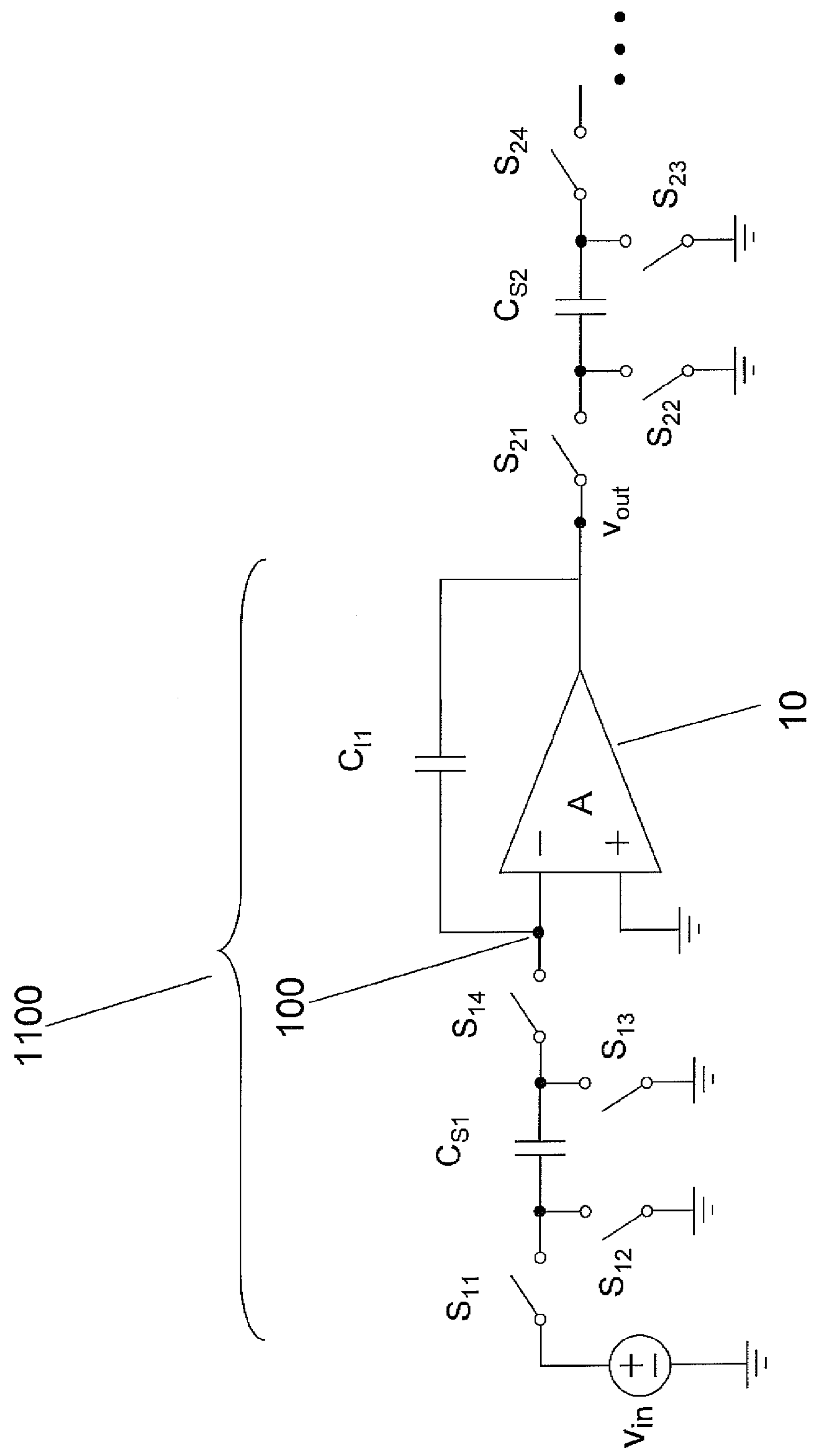
FIG. 2 illustrates a switched-capacitor integrator.
Figure 3:
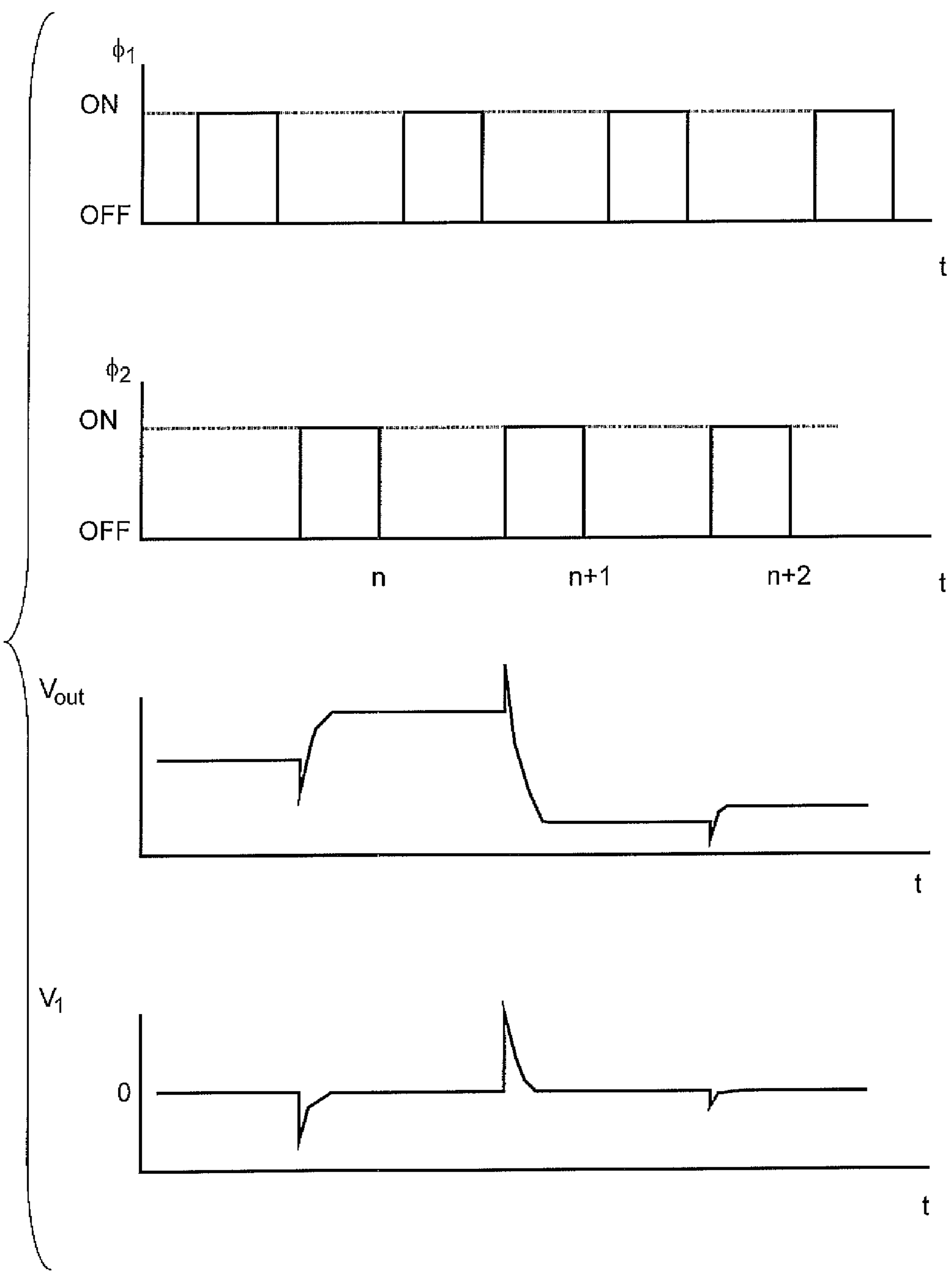
FIG. 3 illustrates a timing diagram for the switched-capacitor integrator of FIG. 2.

As noted above, accurate output voltage can be obtained if Node 100 in FIG. 2 is maintained precisely at ground. However, in sample-data circuits, the only point of time accurate output voltage is required is at the instant the output voltage is sampled by another sampling circuit. Thus, it is not necessary to maintain the voltage at Node 100 at ground all the time.

Figure 4:
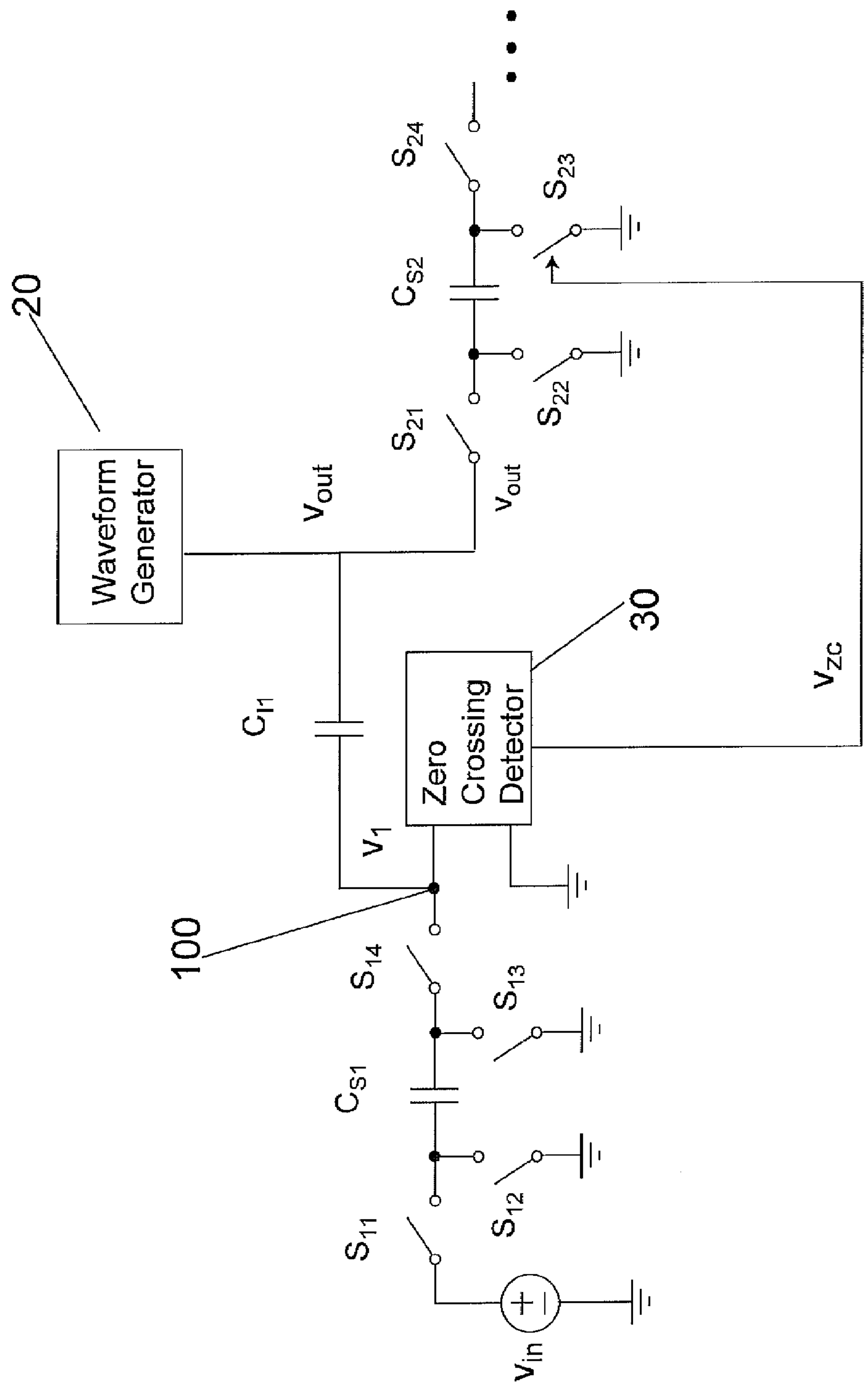
FIG. 4 illustrates a non-inverting integrator according to the concepts of the present invention.

FIG. 4 illustrates a non-inverting integrator according to the concepts of the present invention. More specifically, as an example, a non-inverting integrator with half-clock delay is illustrated in FIG. 4.

As illustrated in FIG. 4, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$. A waveform generator 20 generates a voltage waveform as the output voltage $v_{out}$ in such way the voltage at Node 100 crosses zero if the charge in capacitors $C_{S1}$ and $C_{I1}$ is within a normal operating range.

Figure 5:
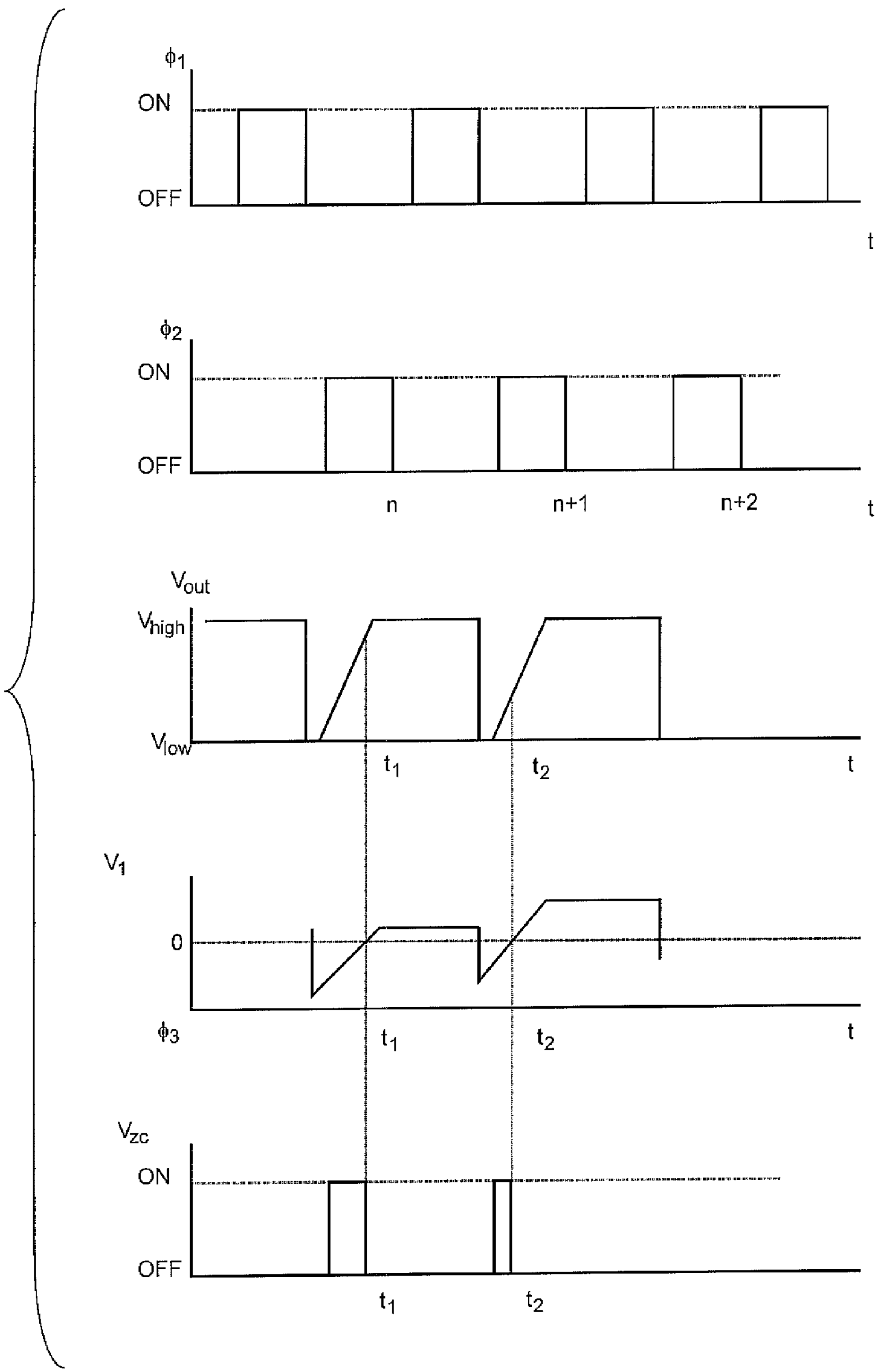
FIG. 5 illustrates a timing diagram for the non-inverting integrator of FIG. 4.

In the timing diagram shown in FIG. 5, the waveform generated by the waveform generator 20 is shown as a ramp. When $v_1$, the voltage at Node 100, crosses zero at time $t_1$, the output $v_{zc}$ of the zero crossing detector 30 goes low, turning the switch $S_{23}$ OFF. At that instant, the output voltage $v_{out}$ is sampled on $C_{S2}$.

Since $v_1$ is very close to zero when the sample of $v_2$ is taken, an accurate output voltage is sampled on $C_{S2}$. A similar operation repeats during the next clock cycle, and the sample of the output voltage is taken at time $t_2$.

It is noted that the zero crossing detector 30 may optionally have an overflow detection feature that determines when the charge in capacitors $Cs_1$ and $C_{I1}$ is outside the normal range of operation. It can be implemented by a logic circuit that makes the output $v_{zc}$ of the zero-crossing detector 30 to go low when $\phi_2$ goes low.

In the event $v_1$ fails to cross zero, the sample is taken on the falling edge of $\phi_2$. At the same time, the logic circuit produces a flag indicating overflow.

In the embodiment described above and in the various embodiments described below, a zero crossing detector is utilized in lieu of a comparator. Typically, a comparator is designed to compare two arbitrary input voltages. A comparator may be implemented as cascaded amplifiers, a regenerative latch, or a combination of both. A comparator may be used to detect a zero voltage level or a predetermined voltage level crossing.

It is noted that the input waveform of the various described embodiments is not arbitrary, but deterministic and repetitive. Thus, the various described embodiments determine the instant the zero voltage level or the predetermined voltage level is crossed than relative amplitudes of the input signals. For such a deterministic input, a zero crossing detector is more efficient.

An example of a zero-crossing detector for the detection of a positive-going input signal is shown in FIG. 1. Initially, node 1 and node 2 are precharged to $V_{DD}$ and ground, respectively. The ramp input voltage $V_{IN}$ is applied according to the zero crossing circuit. At the time the input node crosses the threshold, node 1 is discharged rapidly, and node 2 is pulled up to $V_{DD}$. Since the zero crossing detector in FIG. 1 is a dynamic circuit, there is no DC power consumption, allowing extremely low power and fast operation. For the detection of zero-crossing of a negative-going signal, a complementary circuit with a PMOS input transistor can be utilized.

Figure 6:
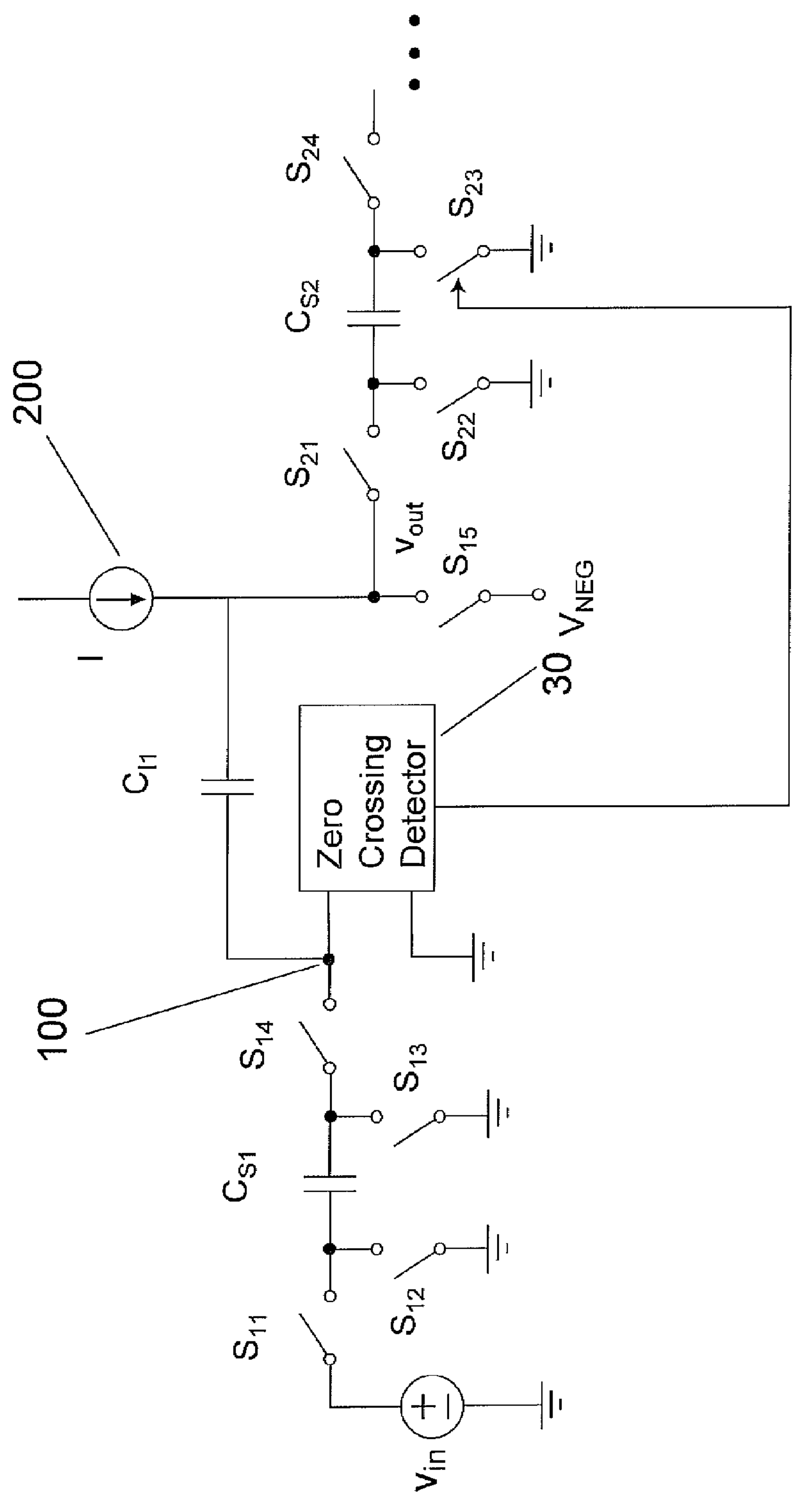
FIG. 6 illustrates a non-inverting integrator with a waveform generator being a current source according to the concepts of the present invention.

As illustrated in FIG. 6, the non-inverting integrator includes a waveform generator which is a current source 200. As illustrated in FIG. 6, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

The current source 200 charges the capacitors $C_{S2}$ and the series connected $C_{S1}$ and $C_{I1}$, generating a ramp. At the start of $\phi_2$, the output is briefly shorted to a known voltage $V_{NEG}$, the value of which is chosen to ensure the voltage $v_1$ at Node 100 crosses zero with signals in the normal operating range.

Figure 7:
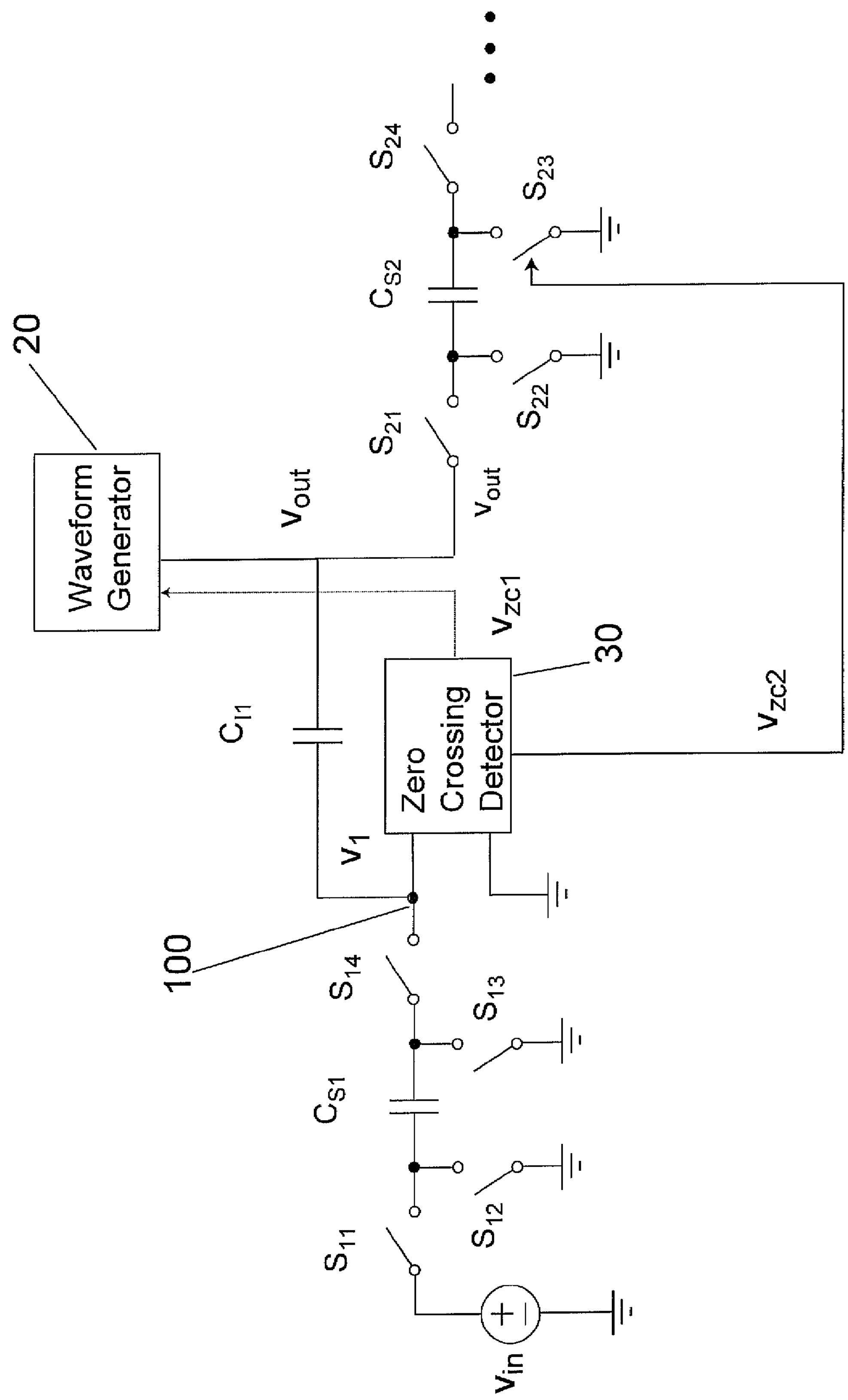
FIG. 7 illustrates another non-inverting integrator according to the concepts of the present invention.

As illustrated in FIG. 7, the non-inverting integrator includes a waveform generator 20 that produces, preferably, a plurality of segments in the waveform with varying rate of change of the output voltage. The first segment may be controlled so as to have the highest rate of change, with subsequent segments having progressively lower rate of change. The detection of zero crossing by the zero crossing detector 30 causes the waveform to advance to the next segment. An output signal $v_{zc2}$ of the zero crossing detector 30 remains high until the zero crossing is detected in the last segment of the waveform.

Figure 8:
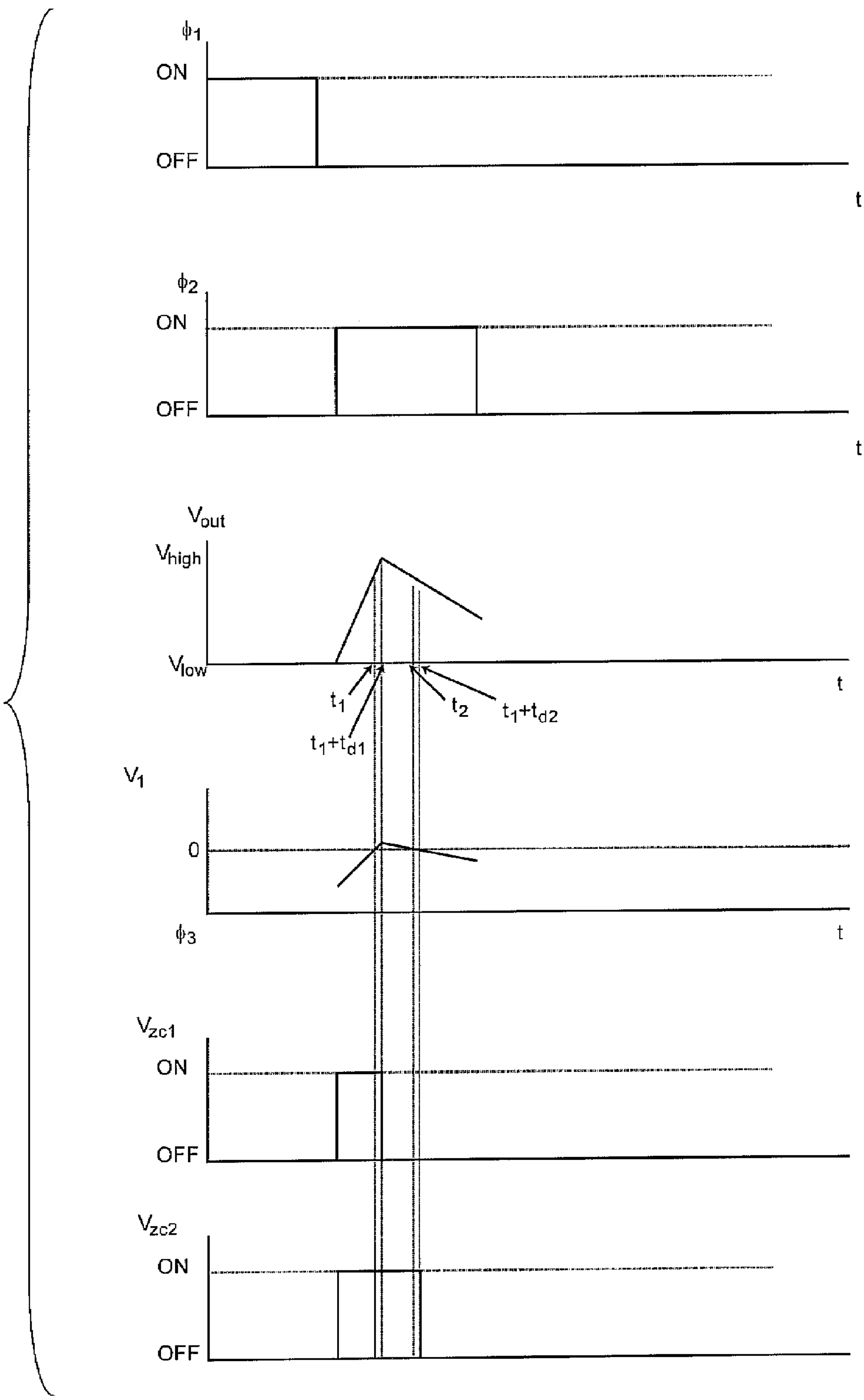
FIG. 8 illustrates a timing diagram for the non-inverting integrator of FIG. 7.

One clock cycle of the timing diagram is shown in FIG. 8. At the start of $\phi_2$, the waveform generator 20 produces an up ramp. The voltage $v_1$ is shown to cross zero at time $t_1$. One output, $v_{zc1}$, of the zero crossing detector 30 changes its state after a finite delay $t_{d1}$.

The delay $t_{d1}$ represents finite delay of a typical zero crossing detector 30. This change of state advances the waveform to the next segment.

Due to the delay $t_{d1}$ of the zero crossing detector 30, the voltage $v_1$ overshoots by a small amount above ground. The second segment of the waveform generator is a down ramp to permit another zero crossing at time $t_2$. After a second delay $t_{d2}$, the output $v_{zc2}$ of the zero crossing detector 30 goes low, causing the switch $S_{23}$ to turn OFF, locking the sample of the output voltage $v_{out}$.

The delay $t_{d2}$ of the second zero crossing is not necessarily the same as the delay associated with the first zero crossing $t_{d1}$. The delay $t_{d2}$ contributes a small overshoot to the sampled output voltage. The effect of the overshoot can be shown to be constant offset in the sampled charge. In most sample-data circuits, such constant offset is of little issue.

The zero crossing detector 30 preferably becomes more accurate in detecting the zero crossing as the segments of the waveform advances. The first detection being a coarse detection, it doesn't have to be very accurate. Therefore, the detection can be made faster with less accuracy. The last zero crossing detection in a given cycle determines the accuracy of the output voltage. For this reason, the last zero crossing detection must be the most accurate.

The accuracy, speed, and the power consumption can be appropriately traded among progressive zero crossing detections for the optimum overall performance. For example, the first detection is made less accurately and noisier but is made faster (shorter delay) and lower power. The last detection is made more accurately and quieter while consuming more power or being slower (longer delay).

Figure 9:
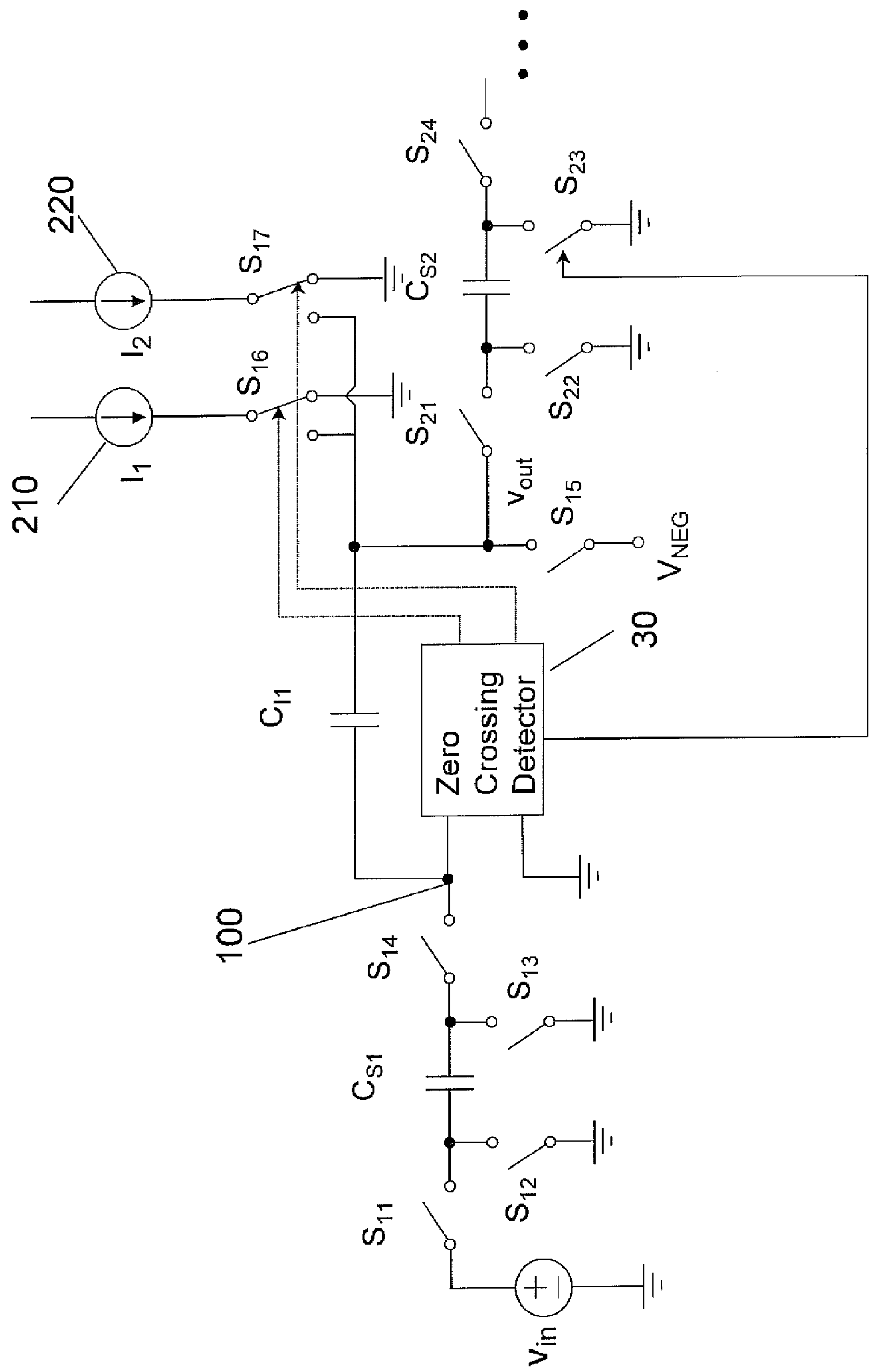
FIG. 9 illustrates another non-inverting integrator according to the concepts of the present invention.

An example of a two-segment waveform generator constructed of two current sources (210 and 220) is shown in FIG. 9. As illustrated in FIG. 9, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

Current sources 210 and 220 charge the capacitors $C_{S2}$ and the series connected $C_{S1}$ and $C_{I1}$ generating two segments of a ramp waveform. At the start of $\phi_2$, the output is briefly shorted to a known voltage $V_{NEG}$, the value of which is chosen to ensure the voltage $v_1$ crosses zero with signals in the normal operating range. During the first segment, the current source 210 is directed to the output, while during the second segment, the current source 220 is directed to the output, generating two different slopes of ramp.

Figure 10:
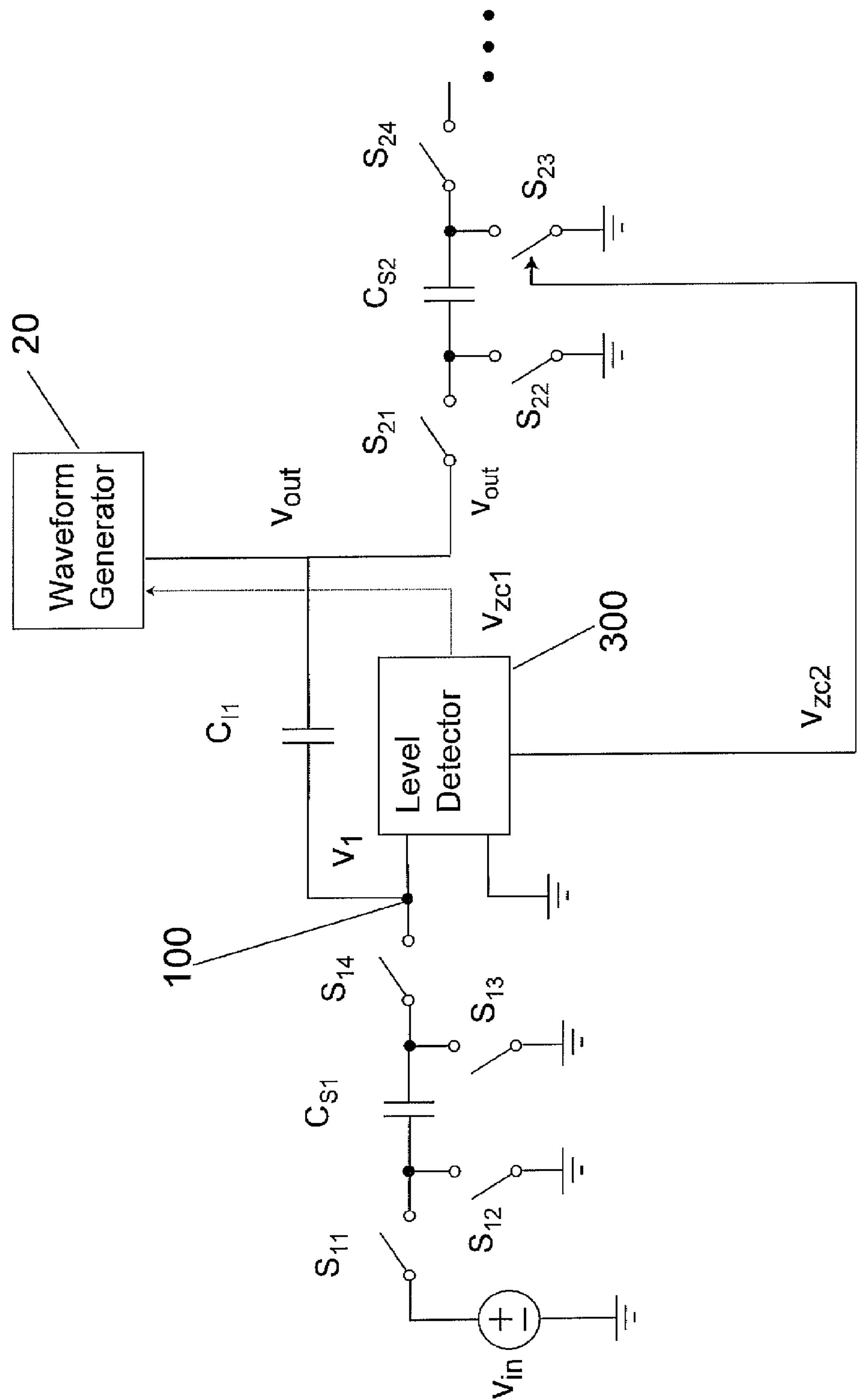
FIG. 10 illustrates another non-inverting integrator according to the concepts of the present invention.

As illustrated in FIG. 10, the non-inverting integrator includes a level crossing detector 300 having plurality of thresholds. As illustrated in FIG. 10, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A level crossing detector 300 is used to detect the point of time at which Node 100 crosses one of plurality of predetermined levels as discussed below. The switch $S_{23}$ is controlled by the output of the level crossing detector 300. The output of the level crossing detector 300 is used to determine the time point to take the sample of the output voltage $v_{out}$.

The thresholds are predetermined voltage levels. The thresholds of the level crossing detector 300 can be adjusted to minimize overshoot.

Figure 11:
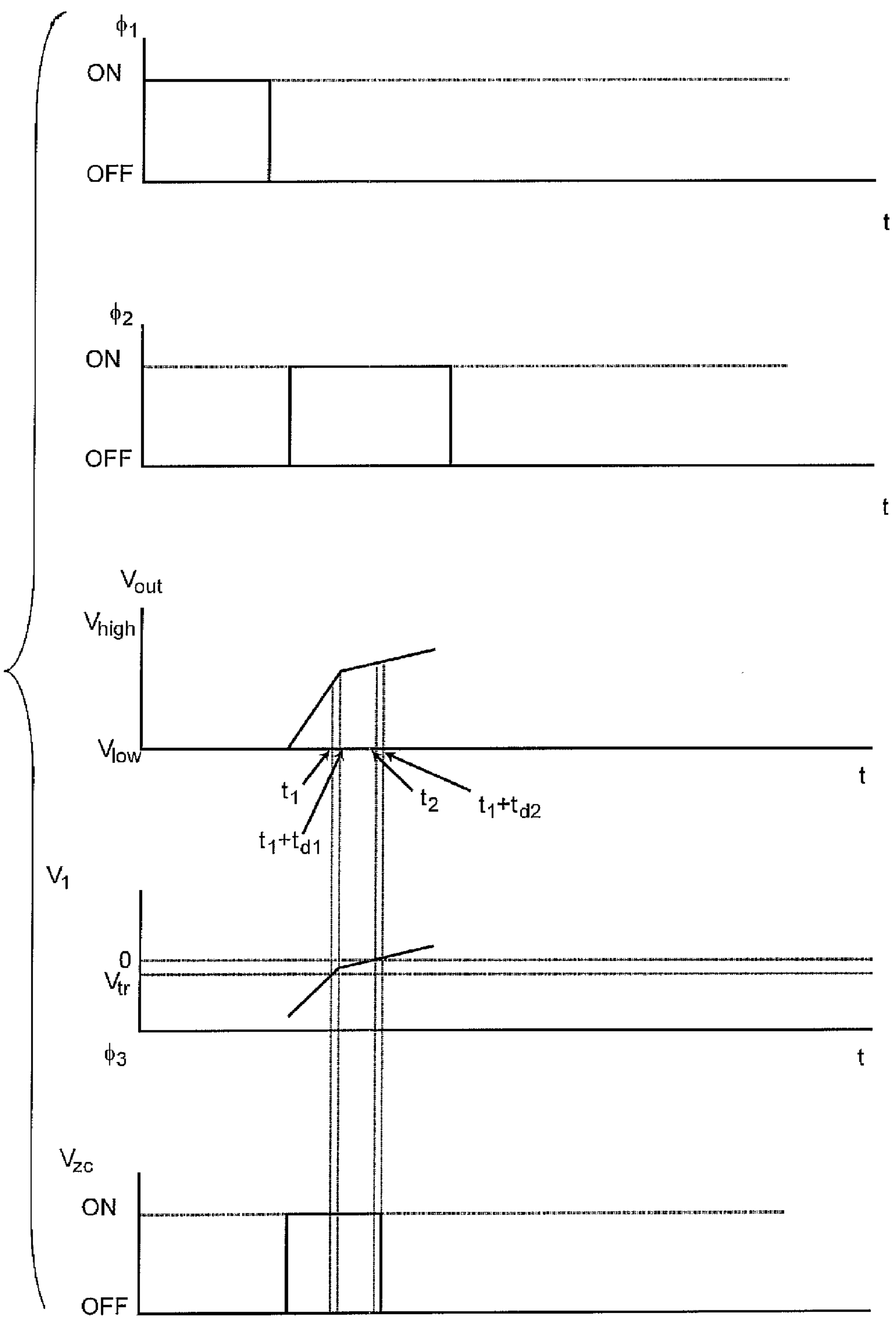
FIG. 11 illustrates a timing diagram for the non-inverting integrator of FIG. 10.

For example, the threshold for the first detection may be made negative by a slightly smaller amount than the expected overshoot in the first segment. This minimizes the ramp-down time in the second segment. Also, the threshold for the second segment may be made more positive by the amount of the overshoot in the second segment in order to cancel the effect of the overshoot. Alternatively, the threshold for the first segment may be made more negative than the expected overshoot during the first segment. This permits the second segment to be a positive ramp rather than a negative ramp as shown in FIG. 11.

It is advantageous to make the detection during the last segment to be the most accurate detection. The accuracy of the detection during the last segment is made higher than during other segments. This can be achieved by making the delay longer or making the power consumption higher during the last segment.

Figure 12:
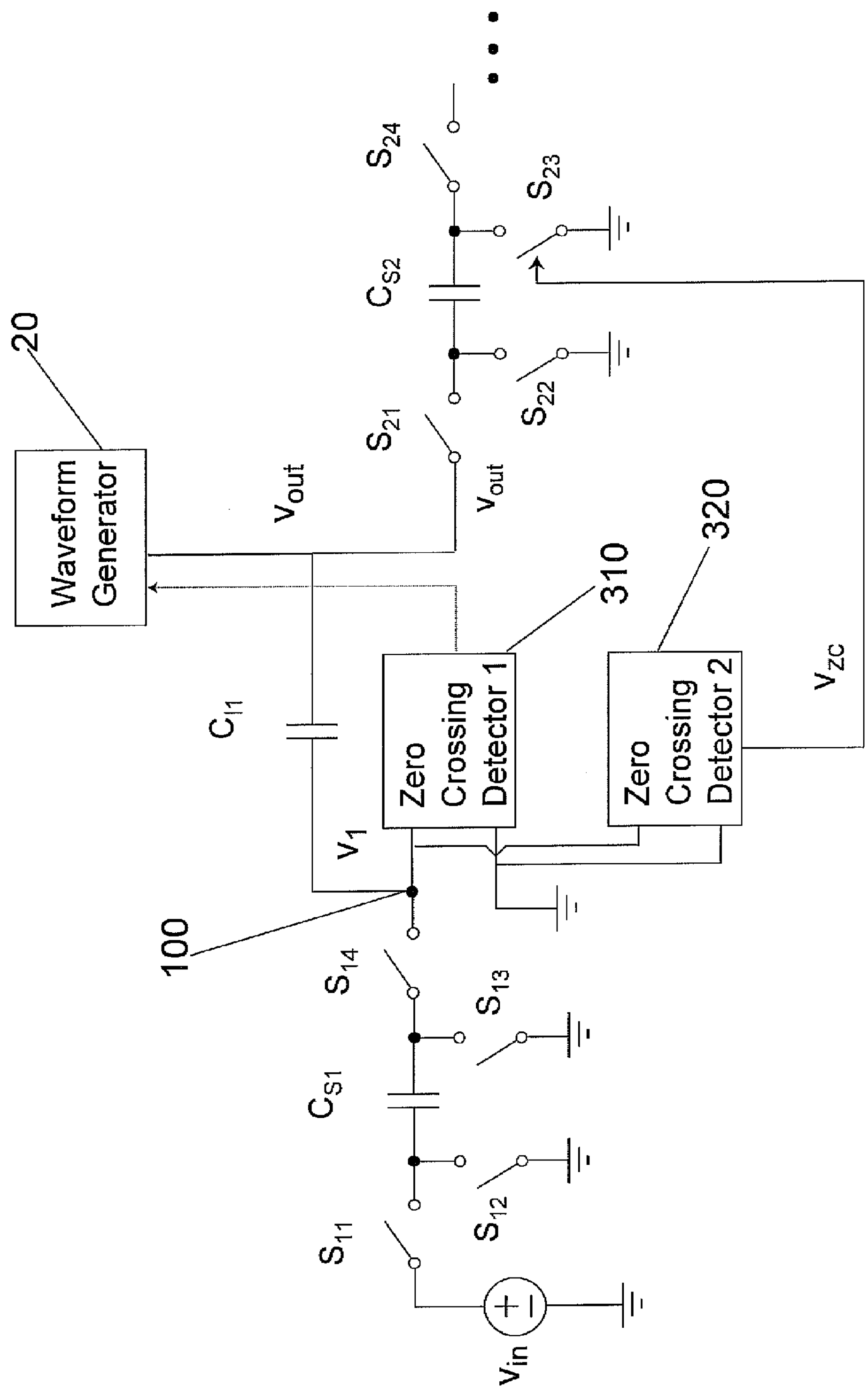
FIG. 12 illustrates another non-inverting integrator according to the concepts of the present invention.

As illustrated in FIG. 12, the non-inverting integrator includes a level crossing detector having two zero-crossing detectors, Zero Crossing Detector 1 (310) and Zero Crossing Detector 2 (320). As illustrated in FIG. 12, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$.

Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

The thresholds of the Zero Crossing Detector 1 (310) and Zero Crossing Detector 2 (320) are selected to minimize overshoot. For example, the threshold for Zero Crossing Detector 1 (310) may be made negative by a slightly smaller amount than the expected overshoot in the first segment. This minimizes the ramp-down time in the second segment. Also, the threshold for Zero Crossing Detector 2 (320) may be made more positive by the amount of the overshoot in the second segment in order to cancel the effect of the overshoot. Alternatively, the threshold for Zero Crossing Detector 1 (310) may be made more negative than the expected overshoot during the first segment. This permits Zero Crossing Detector 2 (320) to be a positive ramp rather than a negative ramp.

In other words, Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 13:
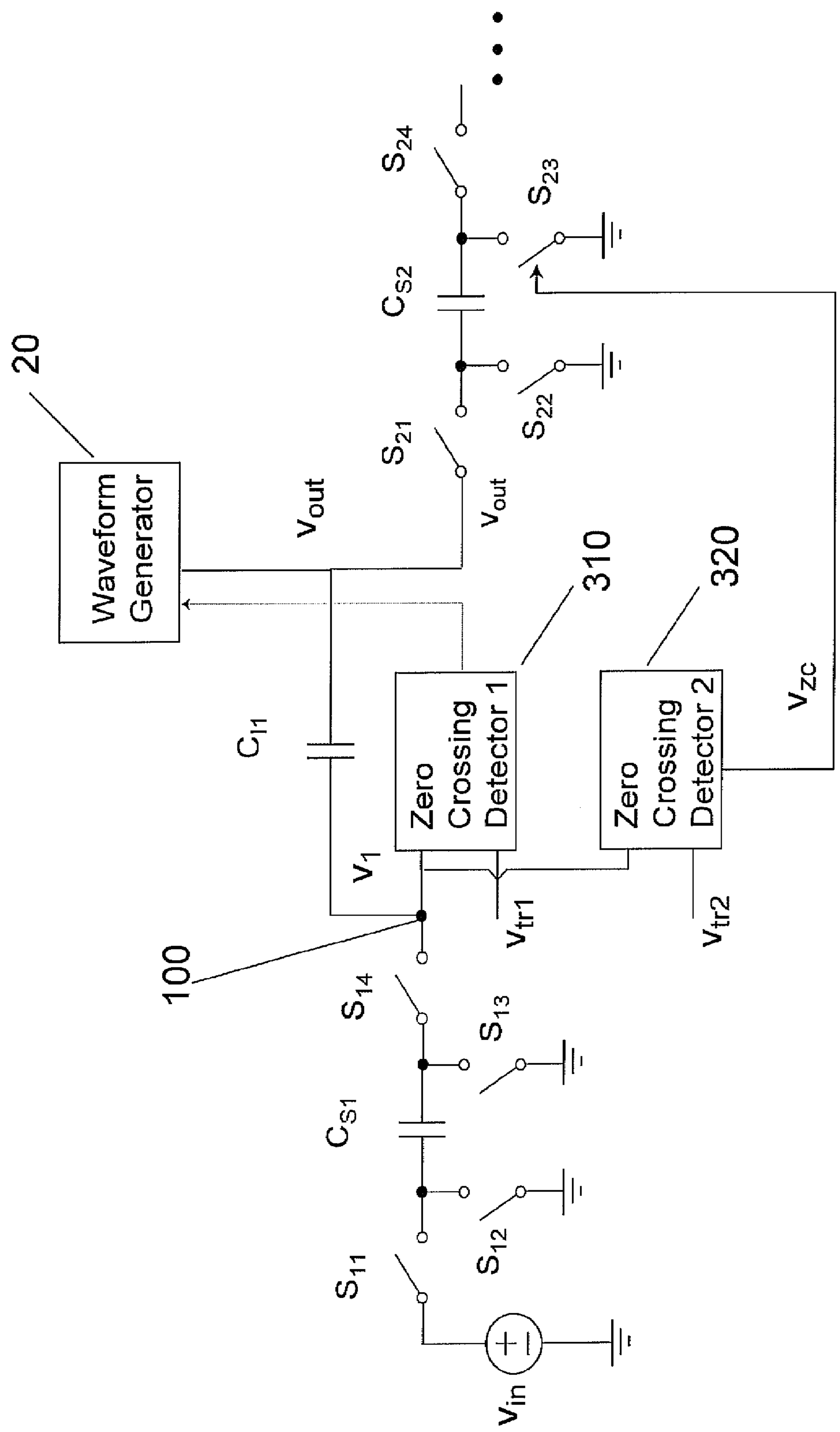
FIG. 13 illustrates another non-inverting integrator according to the concepts of the present invention.

As illustrated in FIG. 13, the non-inverting integrator includes a level crossing detector having two zero-crossing detectors, Zero Crossing Detector 1 (310) and Zero Crossing Detector 2 (320). As illustrated in FIG. 13, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

Both detectors, Zero Crossing Detector 1 (310) and Zero Crossing Detector 2 (320), have nominally zero thresholds. The detection thresholds are determined by voltages $V_{tr1}$ and $V_{tr2}$ applied to the inputs of Zero Crossing Detector 1 (310) and Zero Crossing Detector 2 (320), respectively. Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 14:
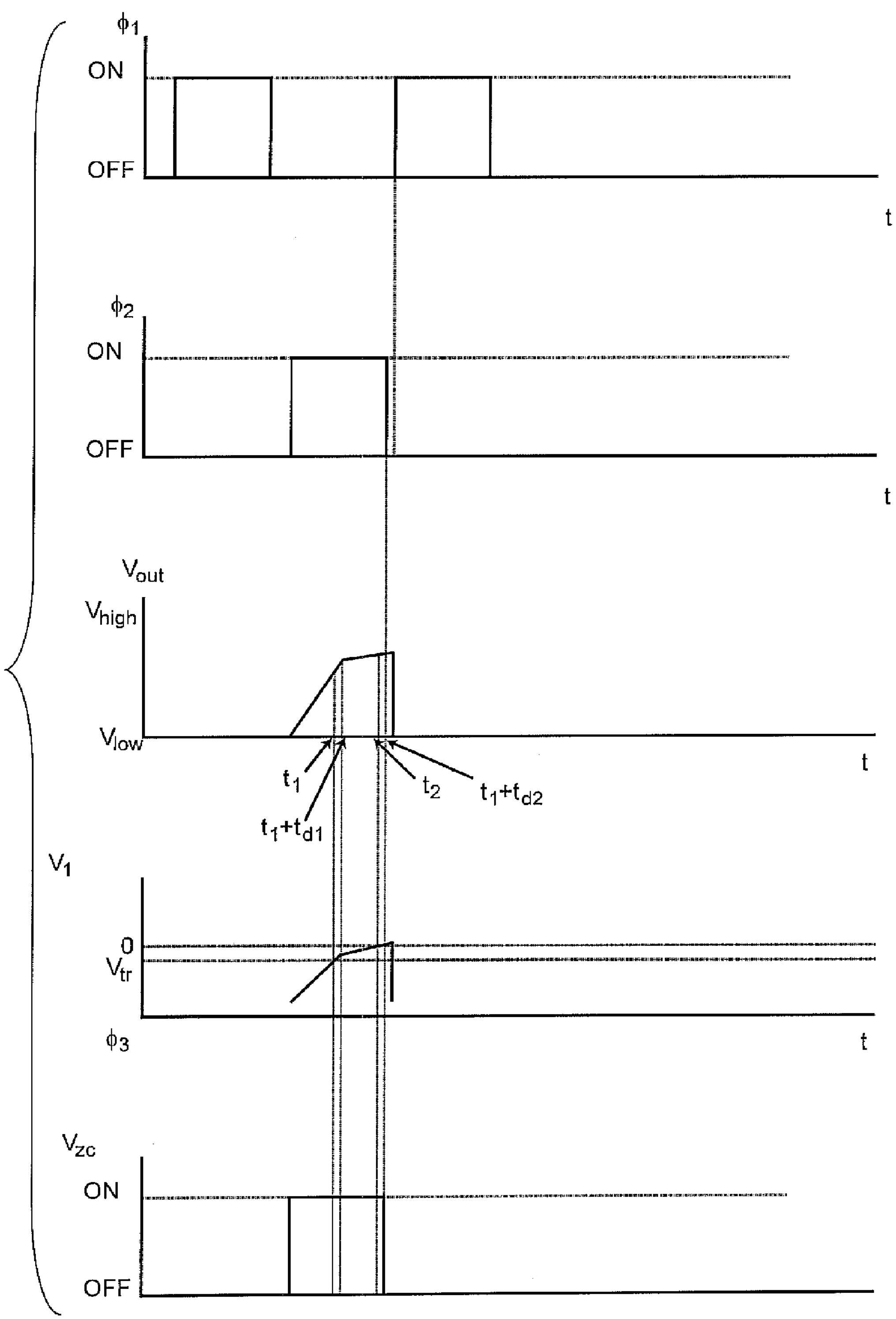
FIG. 14 illustrates a timing diagram for the non-inverting integrator of FIG. 13.

It is noted that the above-described embodiment may operate as a self-timed system. In this configuration, Rather than supplying constant frequency clock phases $\phi_1$ and $\phi_2$, the clock phases are derived from the outputs of Zero Crossing Detector 1 (310) and Zero Crossing Detector 2 (320). FIG. 14 illustrates a self-timed operation.

As illustrated in FIG. 14, the end of the phase $\phi_2$ is defined by the output of the detection during the last segment. The beginning of the clock phase $\phi_1$ is defined by a short delay, such as logic delays, after the end of $\phi_2$. The short delay is generally necessary to ensure non-overlapping clock phases. The end of the clock phase $\phi_1$ is determined by the zero crossing detection of the previous stage or the following stage in the similar manner.

It is noted that the various embodiments described above can be utilized in a pipeline analog-to-digital converter, an algorithmic analog-to-digital converter, a switched-capacitor amplifier, a delta-sigma modulator, or a self-timed algorithmic analog-to-digital converter.

It is further noted that the various embodiments described above have signal paths that are single-ended, thus, it is desirable to provide differential signal paths. The various embodiments described below provide differential signal paths.

As noted above, it is desirable to substantially eliminate the errors associated with time delays. One solution to substantially eliminate the errors associated with time delays is to have the error in a form that can be easily managed.

For example, if a waveform generator produces a ramp whose slope is constant in each segment of the ramp, the error associated with the delays becomes a constant DC offset. A constant DC offset can be easily compensated or tolerated in most systems. However, simple waveform generators, for example, the one shown in FIG. 6, produce non-linear ramp signals. The nonlinearity in the ramp slope of the conventional sample-data circuits causes nonlinearity in the resulting sample-data circuit error. The non-linear error is difficult to compensate.

To address this problem, the present invention provides a circuit that generates ramp waveforms with plurality of linear segments of varying slopes whereby the slope is independent of the output voltage and load conditions in each segment of the ramp. By generating ramp waveforms with plurality of linear segments of varying slopes, the error is a plurality of constant DC offsets that can easily compensated for or tolerated.

Furthermore, to address this problem, the present invention provides a circuit that generates ramp waveforms with plurality of linear segments of varying slopes whereby the advancement to the next segment is controlled by an output of a zero crossing detector.

Figure 15:
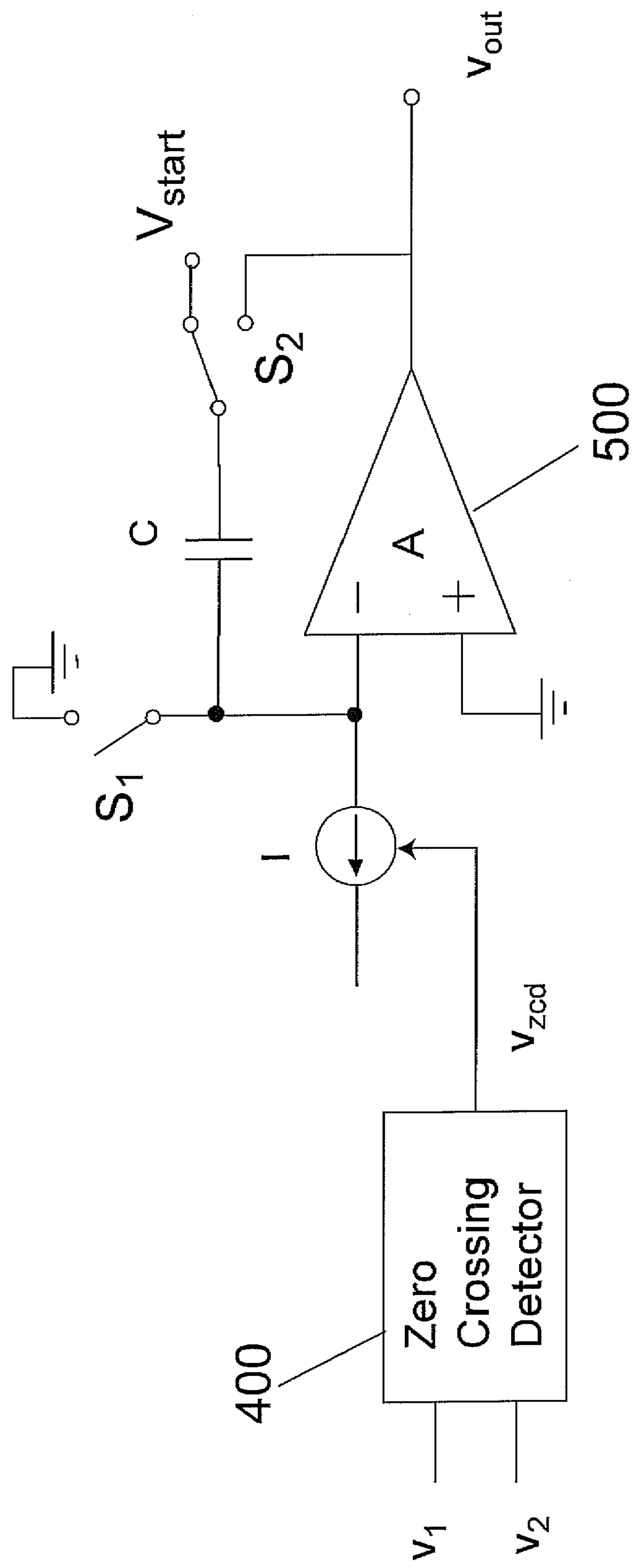
FIG. 15 illustrates one embodiment of a sample-data circuit according to the concepts of the present invention.

One embodiment of the present invention that provides a circuit that generates ramp waveforms with plurality of linear segments of varying slopes is illustrated in FIG. 15. As illustrated in FIG. 15, a sample-data circuit includes an amplifier 500 that preferably provides large open loop gain. A zero crossing detector 400 detects the condition when an input voltage $v_1$ crosses another input voltage $v_2$, at which time the output signal $v_{zcd}$ changes, signaling the detection of zero-crossing.

It is noted that a continuous-time voltage comparator can be used as a zero crossing detector. It is further noted that the zero crossing detector 400 may have a non-zero threshold voltage, if desired. Thus, a voltage level detector can be employed instead.

As illustrated in FIG. 15, before the start of the first segment of a ramp waveform generation, a capacitor C is precharged to a start voltage $V_{start}$ by turning a switch $S_1$ ON and connecting a switch $S_2$ to the upper position, the upper position being connected to start voltage $V_{start}$. Next, the switch $S_1$ is turned OFF, and the switch $S_2$ is connected to the lower position. The capacitor C now provides negative feedback.

In a single-slope operation as shown in FIG. 5, current source I provides constant current. For a multi-slope operation as shown in FIGS. 8 and 11, the current source I is a variable current source, and set to one of a plurality of current levels $I_1$. The output voltage $v_{out}$ is approximately a linear ramp given by $v_{out}=V_{start}+I_1t/C$. In one embodiment, the current source I is implemented by a resistor connected to a constant voltage. In another embodiment, the current source I is implemented by a MOS transistor.

If $I_1$ is positive, the resulting $v_{out}$ is a positive-going ramp. In a multi-slope operation, when the output signal $v_{zcd}$ of the zero crossing detector 400 changes at time $t=t_1$, the value of the current source I is changed to the next value $I_2$ in order to produce the next segment of the ramp. The output voltage $v_{out}$ in the second segment is $v_{out}=V_{start}+I_1t_1/C+I_2t/C$.

A negative-going second segment of the ramp can be generated by making $I_2$ negative. More segments can be produced by changing the value of the current I. In this embodiment, a ramp waveform generator produces substantially constant slope within each segment regardless of the load condition.

Figure 16:
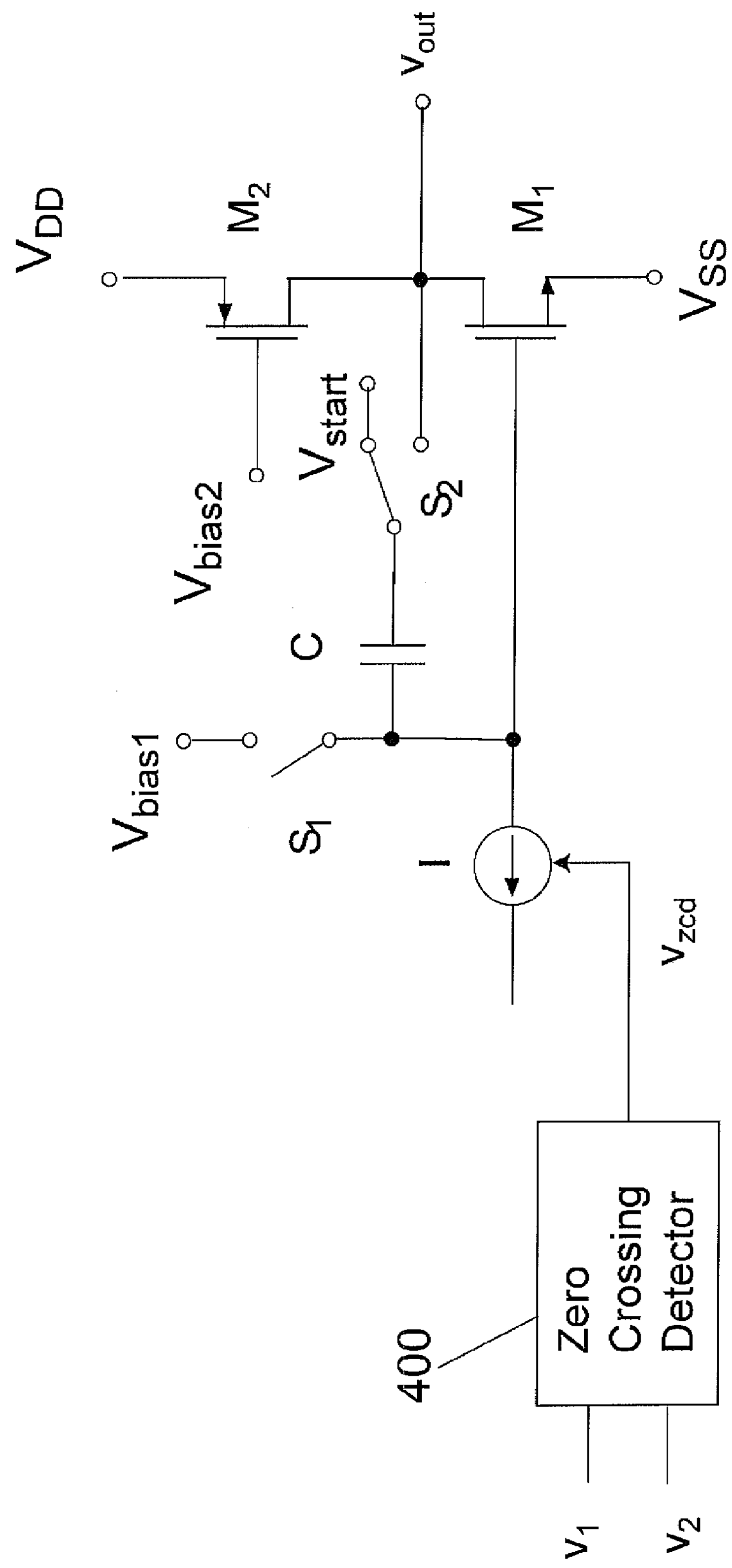
FIG. 16 illustrates another embodiment of a sample-data circuit according to the concepts of the present invention.

FIG. 16 shows another embodiment of the present invention created with CMOS technology. The structure and the operation are similar to the embodiment illustrated and described with respect to FIG. 15.

As illustrated in FIG. 16, an amplifier includes MOS transistors $M_1$ and $M_2$. A zero crossing detector 400 detects the condition when an input voltage $v_1$ crosses another input voltage $v_2$, at which time the output signal $v_{zcd}$ changes, signaling the detection of a zero-crossing.

It is noted that a continuous-time voltage comparator can be used as a zero crossing detector. It is further noted that the zero crossing detector 400 may have a non-zero threshold voltage, if desired. Thus, a voltage level detector can be employed instead.

As illustrated in FIG. 16, before the start of the first segment of a ramp waveform generation, a capacitor C is precharged by turning a switch $S_1$ ON and connecting a switch $S_2$ to the upper position, the upper position being connected to start voltage $V_{start}$. This precharges the capacitor C to $V_{start}-V_{bias1}$. The voltage $V_{bias1}$ may be approximately the same as the gate voltage of $M_1$. Next, the switch $S_1$ is turned OFF, and the switch $S_2$ is connected to the lower position. The capacitor C now provides negative feedback. In a single-slope operation as shown in FIG. 5, current source I provides constant current. For a multi-slope operation as shown in FIGS. 8 and 11, the current source I is a variable current source, and set to one of the plurality of current levels $I_1$. The output voltage $v_{out}$ is approximately a linear ramp given by $v_{out}=V_{start}+I_1t/C$. In one embodiment, the current source I is implemented by a resistor connected to a constant voltage. In another embodiment, the current source I is implemented by a MOS transistor.

If $I_1$ is positive, the resulting $v_{out}$ is a positive-going ramp. In a multi-slope operation, when the output signal $v_{zcd}$ of the zero crossing detector 400 changes at time $t=t_1$, the value of the current source I is changed to the next value $I_2$ in order to produce the next segment of the ramp. The output voltage $v_{out}$ is $v_{out}=V_{start}+I_1t_1/C+I_2t/C$.

A negative-going second segment of the ramp can be generated by making $I_2$ negative. More segments can be produced by changing the value of the current I. In this embodiment, a ramp waveform generator produces substantially constant slope within each segment regardless of the load condition.

Figure 17:
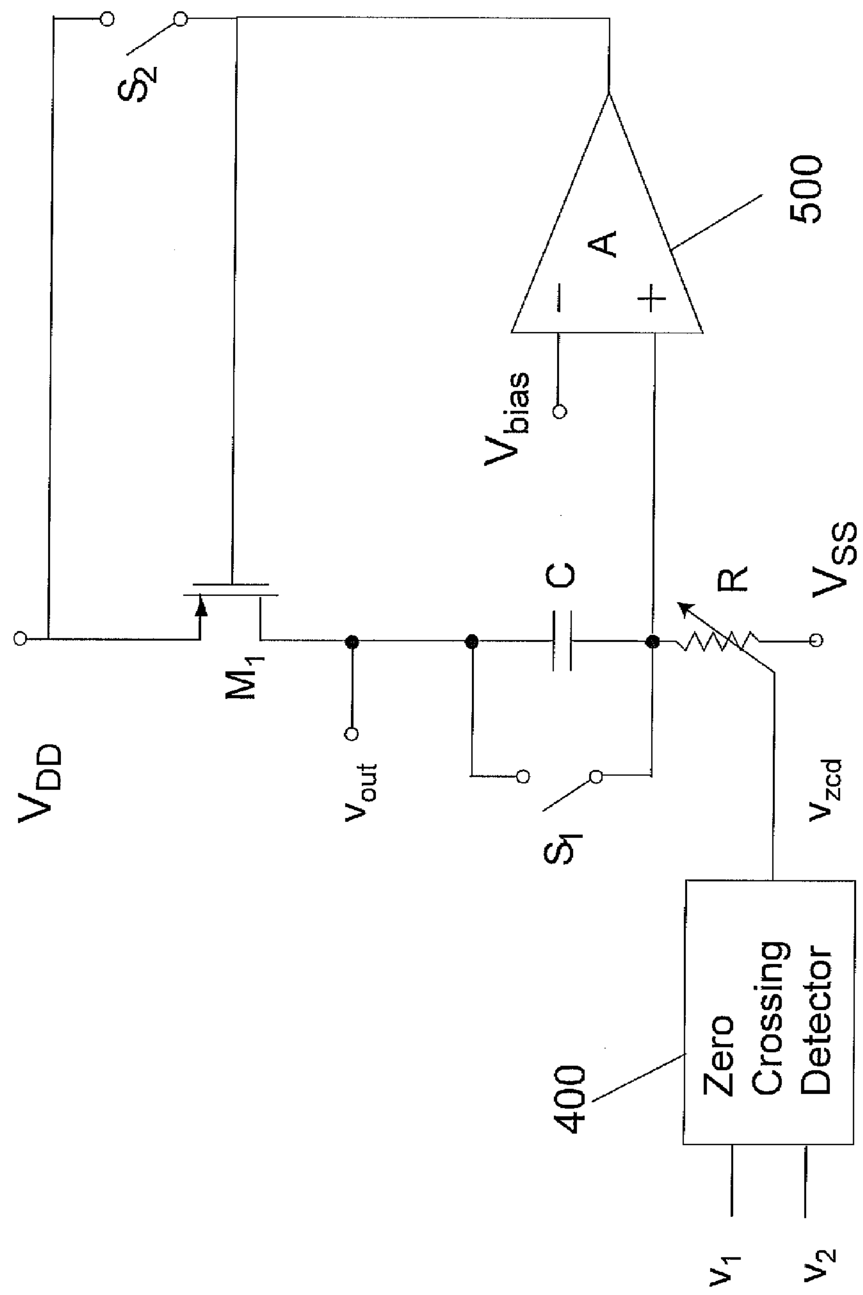
FIG. 17 illustrates another embodiment of a sample-data circuit according to the concepts of the present invention.

FIG. 17 shows another embodiment of the present invention. As illustrated in FIG. 17, a sample-data circuit includes a differential amplifier 500 that provides, preferably, a large open-loop gain. Before the start of the ramp generation, the switch $S_1$ is closed, and a first value $R_1$ of the resistor R is selected.

By the negative feedback through the transistor $M_1$ and the resistor R, the voltage across the resistor R is maintained at $V_{bias}-V_{SS}$. Thus, the current through the resistor is $I_1=(V_{bias}-V_{SS})/R_1$, and the initial output voltage is $V_{bias}$.

Next, the switch $S_1$ is opened. By the negative feedback through the transistor $M_1$, the capacitor C, and the resistor R, the voltage across R is still maintained at $V_{bias}-V_{SS}$ and the current through the resistor R at $I_1=(V_{bias}-V_{SS})/R_1$. The capacitor C is charged by the current $I_1$, giving the output voltage $v_{out}=V_{bias}+I_1t/C=V_{bias}+(V_{bias}-V_{SS})t/R_1C$.

In a multi-slope operation, when the output signal $v_{zcd}$ of the zero crossing detector changes at time $t=t_1$, the value of the resistor R is changed to the next value $R_2$ in order to produce the next segment of the ramp. The output voltage $v_{out}$ in the second segment is $v_{out}=V_{bias}+(V_{bias}-V_{SS})t_1/R_1C+(V_{bias}-V_{SS})t_2/R_2C$. More segments can be produced by further changing the value of the resistor R. In this embodiment, a ramp waveform generator produces substantially constant slope within each segment regardless of the load condition.

The embodiment of FIG. 17 can generate multiple segments of a positive-going ramp waveform. The ramp can be stopped by turning the switch $S_2$ ON, which cuts off the transistor $M_1$.

Figure 18:
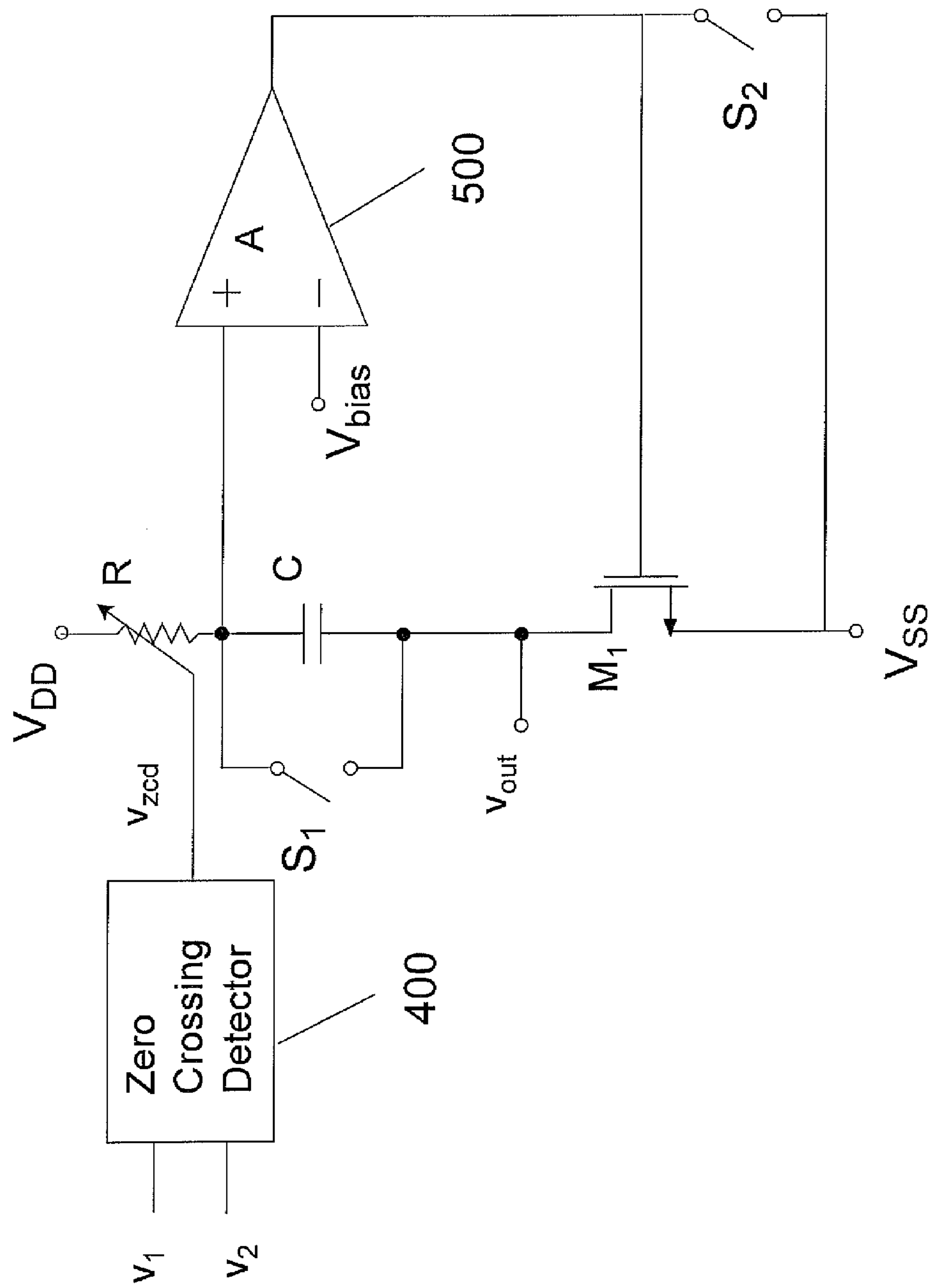
FIG. 18 illustrates another embodiment of a sample-data circuit according to the concepts of the present invention.

FIG. 18 shows a complimentary embodiment of FIG. 17. As illustrated in FIG. 18, a sample-data circuit includes a differential amplifier 500 that provides, preferably, a large open-loop gain. Before the start of the ramp generation, the switch $S_1$ is closed, and a first value $R_1$ of the resistor R is selected.

By the negative feedback through the transistor $M_1$ and the resistor R, the voltage across the resistor R is maintained at $V_{bias}-V_{DD}$. Thus, the current through the resistor is $I_1=(V_{bias}-V_{DD})/R_1$, and the initial output voltage is $V_{bias}$.

Next, the switch $S_1$ is opened. By the negative feedback through the transistor $M_1$, the capacitor C, and the resistor R, the voltage across R is still maintained at $V_{bias}-V_{DD}$ and the current through the resistor R at $I_1=(V_{bias}-V_{DD})/R_1$. The capacitor C is charged by the current $I_1$, giving the output voltage $v_{out}=V_{bias}+I_1t/C=V_{bias}+(V_{bias}-V_{DD})t/R_1C$.

In multi-slope operation, when the output signal $v_{zcd}$ of the zero crossing detector changes at time $t=t_1$, the value of the resistor R is changed to the next value $R_2$ in order to produce the next segment of the ramp. The output voltage $v_{out}$ in the second segment is $v_{out}=V_{bias}+(V_{bias}-V_{DD})t_1/R_1C+(V_{bias}-V_{DD})t_2/R_2C$. Multiple segments of a negative-going ramp waveform can be produced by further changing the value of the resistor R. In this embodiment, a ramp waveform generator produces substantially constant slope within each segment regardless of the load condition.

Figure 19:
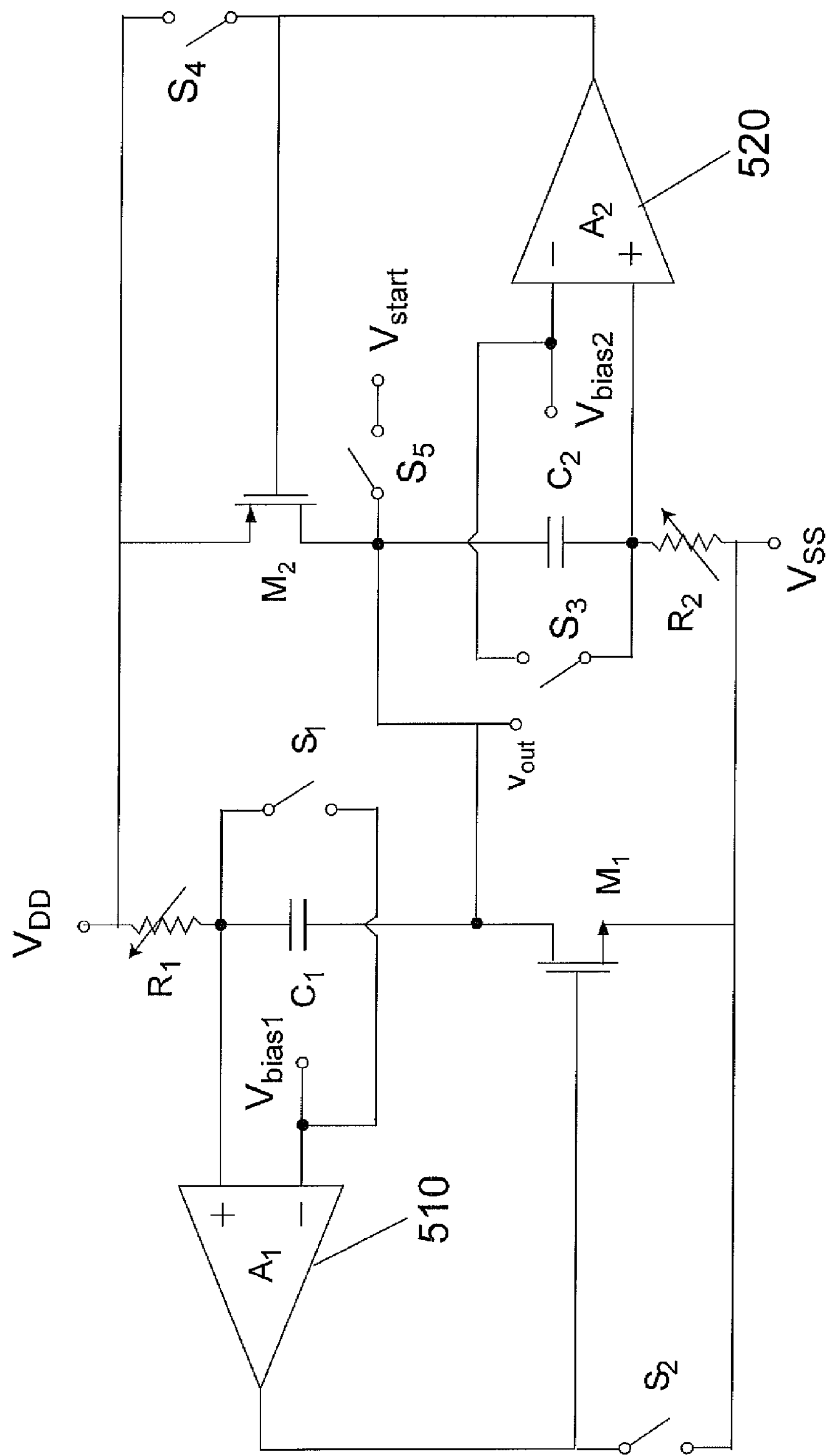
FIG. 19 illustrates another embodiment of a sample-data circuit according to the concepts of the present invention.

Both positive-going and negative-going segments can be generated by another embodiment, as illustrated by FIG. 19. As illustrated by FIG. 19, before the start of the first segment, switches $S_1$, $S_2$, $S_3$, and $S_5$ are closed, and $S_4$ is opened. This configuration precharges a capacitor $C_1$ at $V_{start}-V_{bias1}$ and another capacitor $C_2$ at $V_{start}-V_{bias2}$, setting the initial condition of the output voltage at $V_{start}$.

A first value $R_2(\mathbf{1})$ of the resistor $R_2$ is selected. By the negative feedback through the transistor $M_2$ and the resistor $R_2$, the voltage across $R_2$ is maintained at $V_{bias2}-V_{SS}$. Thus, the current through the resistor is given by $I_1=(V_{bias2}-V_{SS})/R_2(\mathbf{1})$.

The first segment starts by opening switches $S_3$ and $S_5$. The capacitor $C_2$ is charged by the current $I_1$, giving a positive-going ramp output voltage. Negative-going segments can be produced by turning switches $S_3$ and $S_4$ ON, and turning $S_1$ and $S_2$ OFF. In this embodiment, a ramp waveform generator produces substantially constant slope within each segment regardless of the load condition.

It is noted that since a zero crossing detector must detect the zero crossing preferably continuously, a continuous-time voltage comparator can be used as a zero-crossing detector.

Figure 20:
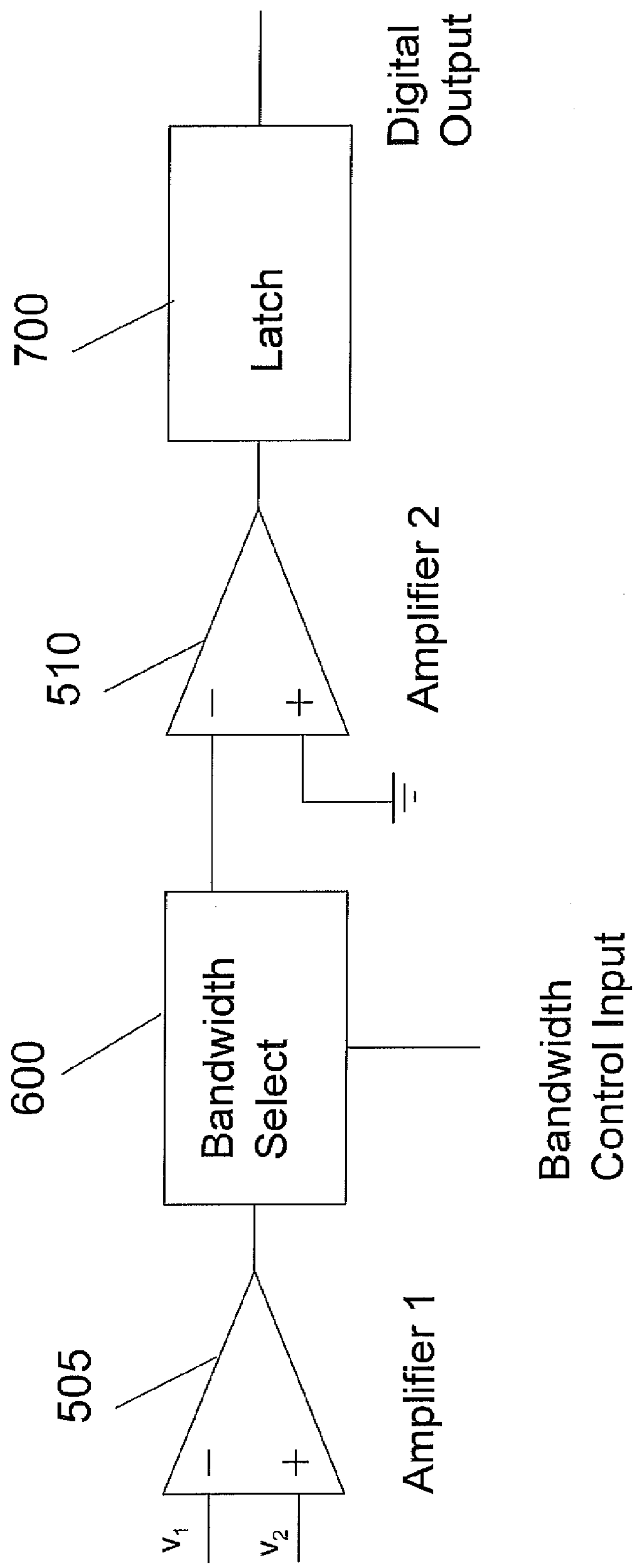
FIG. 20 illustrates an embodiment a continuous-time voltage comparator for a sample-data circuit according to the concepts of the present invention.

FIG. 20 illustrates an embodiment of a continuous-time voltage comparator to be used in the present invention. As illustrated in FIG. 20, the continuous-time comparator includes a first amplifier stage 505 that amplifies the difference between the two input voltages $v_1$ and $v_2$.

Figure 21:
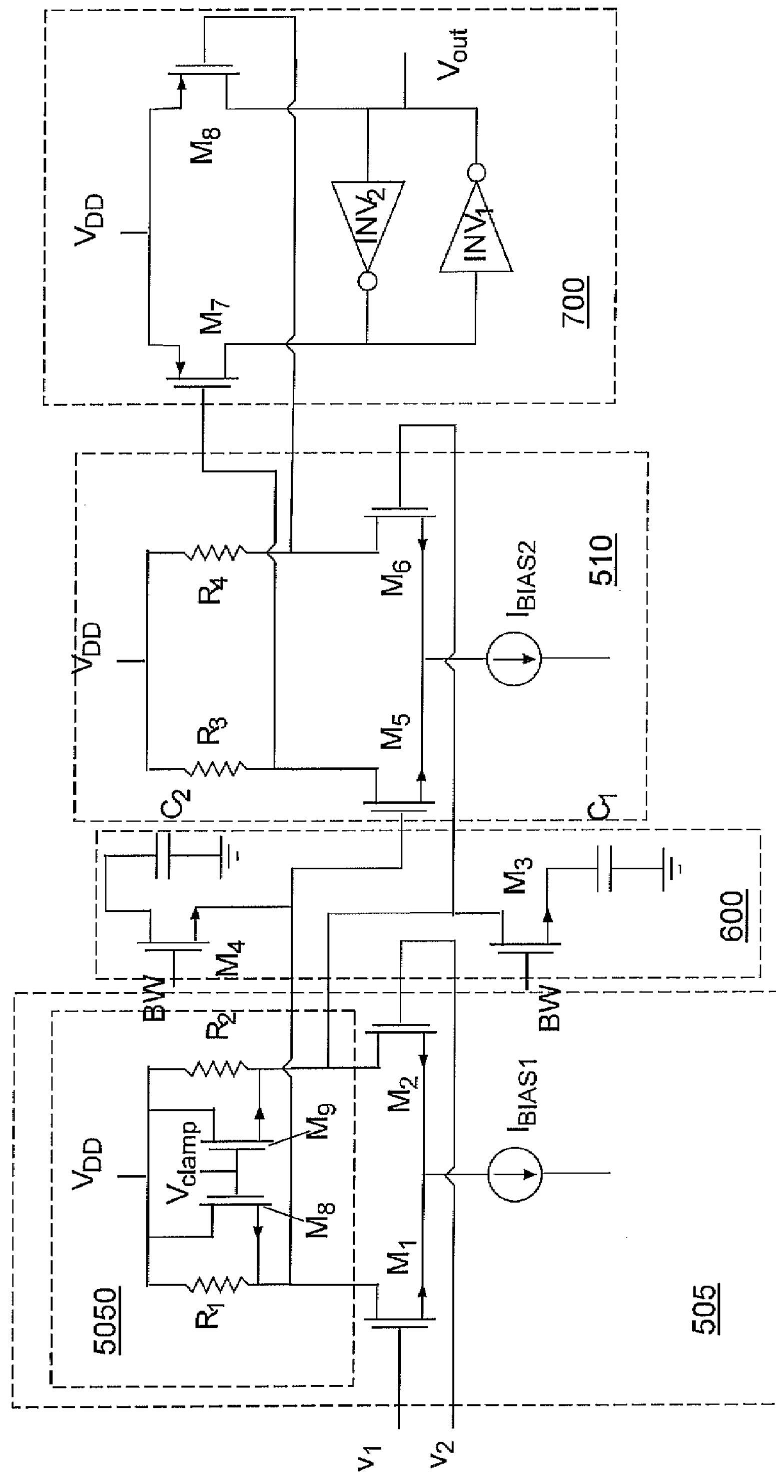
FIG. 21 illustrates another embodiment a continuous-time voltage comparator for a sample-data circuit according to the concepts of the present invention.

The first amplifier stage 505 includes a clamping circuit 5050, as illustrated in FIG. 21, wherein the clamping circuit 5050 includes transistors $M_8$ and $M_9$. The clamping circuit 5050 limits the output voltage swing to shorten the delay. It is noted that a similar clamping circuit can be employed in other amplifier stages if desired.

As illustrated in FIG. 20, the output of the amplifier 505 is connected to a bandwidth select circuit 600. The output of the first amplifier stage is further amplified by a second amplifier stage 510. A latch circuit 700 generates logic level output. It is noted that a Schmitt trigger-type circuit can be used as a continuous-time latch.

The bandwidth select circuit 600 provides different bandwidths depending on different segments of the ramp waveform. The zero crossing detection during the first segment can be a coarse detection, as the zero crossing detection during the first segment does not have to be very accurate. However, since the detection is made while the input to the detector is changing rapidly, the detection needs to be fast.

On the other hand, the zero crossing detection during the last segment in a given cycle determines the accuracy of the output voltage. Therefore, the bandwidth during the first segment can be designed to be high and progressively lower for detection in successive segments to reduce noise for accurate zero crossing detection.

Figure 22:
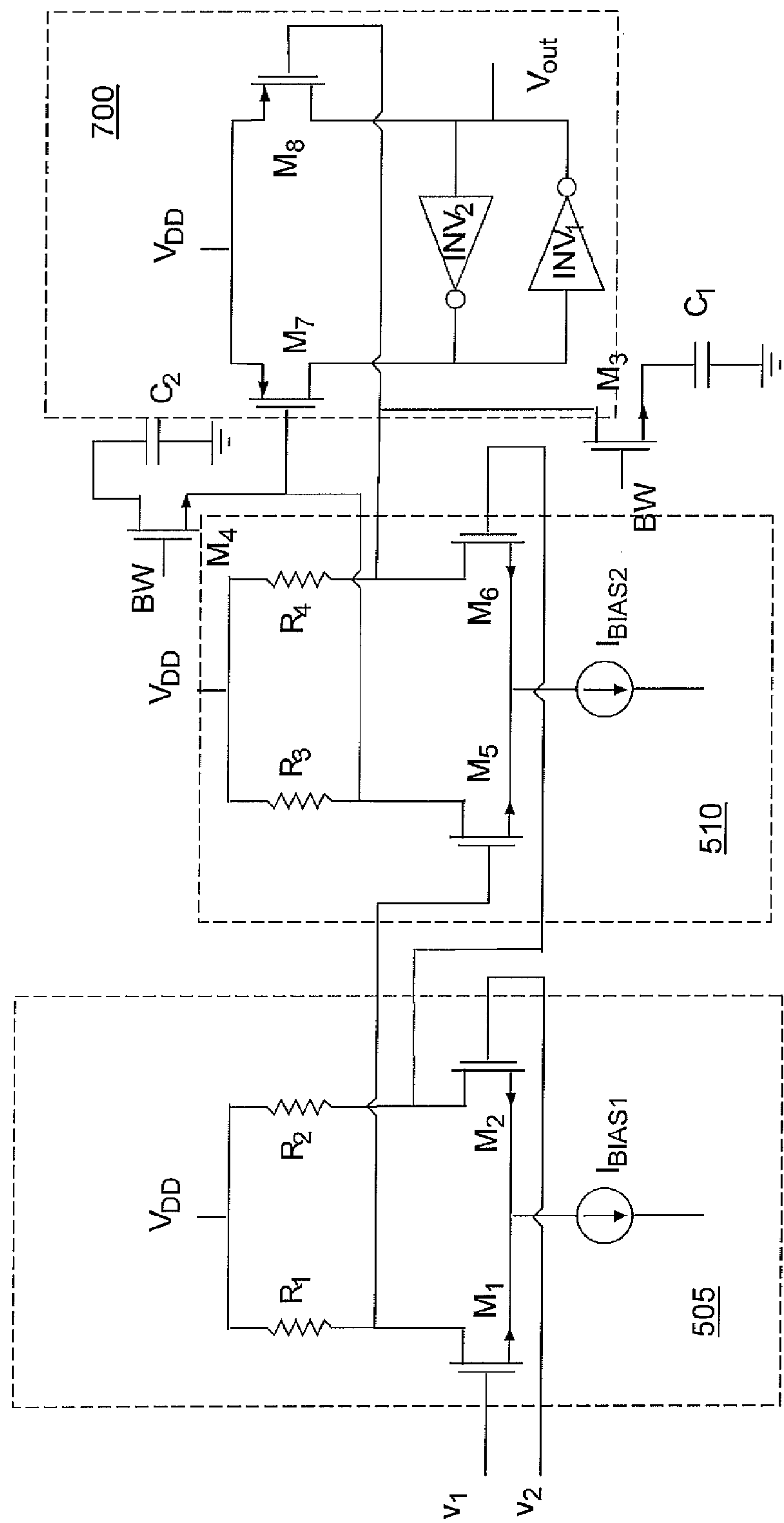
FIG. 22 illustrates another embodiment a continuous-time voltage comparator for a sample-data circuit according to the concepts of the present invention.

Since the mean-square value of noise is approximately proportional to bandwidth, the bandwidth is made lower during the later segments by the bandwidth select circuit. The bandwidth selection is made at the output of the first amplifier stage 505 by the input signal BW, as illustrated by FIG. 21. Alternatively, the bandwidth selection can be made at the output of the second amplifier stage 510 as illustrated by FIG. 22. Also, it is noted that the number of amplifier stages is increased in a high resolution operation.

An alternative method of bandwidth change is to control the bias currents $I_{bias1}$ and/or $I_{bias2}$ by the zero crossing detector instead of switching in or out the band-limiting capacitors $C_1$ and $C_2$. The higher the bias currents of a stage, the higher the bandwidth of that stage becomes.

As noted above, FIG. 21 illustrates another embodiment of a continuous-time voltage comparator to be used in the present invention. As illustrated in FIG. 21, a first amplifier stage 505 includes transistors $M_1$ and $M_2$ and resistors $R_1$ and $R_2$. A second amplifier stage 510 includes transistors $M_5$ and $M_6$ and resistors $R_3$ and $R_4$.

It is noted that a clamping circuit that limits the output voltage swing can be employed to shorten the delay in the amplifier stages.

Since the effect of the noise from the second amplifier stage 510 is reduced by the voltage gain of the first stage 505, a second stage bias current $I_{bias2}$ can be made lower than a first stage bias current $I_{bias1}$ in order to reduce power consumption.

As illustrated in FIG. 21, a latch includes transistors $M_7$ and $M_8$ and inverters $Inv_1$ and $Inv_2$. A bandwidth select circuit 600 includes switches $M_3$ and $M_4$ and capacitors $C_1$ and $C_2$ For the zero crossing detection during the first segment where high speed is desired, the switches $M_3$ and $M_4$ are kept OFF. The bandwidth of the first amplifier stage 505 is determined by the resistors $R_1$ and $R_2$ and parasitic capacitance at the output of the first stage 505.

For the zero crossing detection during the segments where low noise is necessary, the switches $M_3$ are $M_4$ are turned ON. The added capacitance from $C_1$ and $C_2$ at the outputs of the first stage 505 reduces the bandwidth, lowering the noise.

With nominally matched transistors and resistors, the detection threshold is zero. However, by varying either $R_1$ or $R_2$, the detection threshold can be varied to cancel the effect of overshoot in each segment of the ramp.

FIG. 22 illustrates another embodiment of a continuous-time voltage comparator to be used in the present invention. As illustrated in FIG. 22, a first amplifier stage 505 includes transistors $M_1$ and $M_2$ and resistors $R_1$ and $R_2$. A second amplifier stage 510 includes transistors $M_5$ and $M_6$ and resistors $R_3$ and $R_4$.

It is noted that a clamping circuit that limits the output voltage swing can be employed to shorten the delay in the amplifier stages.

Since the effect of the noise from the second amplifier stage 510 is reduced by the voltage gain of the first stage 505, a second stage bias current $I_{bias2}$ can be made lower than a first stage bias current $I_{bias1}$ in order to reduce power consumption.

As illustrated in FIG. 22, a latch includes transistors $M_7$ and $M_8$ and inverters $Inv_1$ and $Inv_2$. A bandwidth select circuit includes switches $M_3$ and $M_4$ and capacitors $C_1$ and $C_2$.

For the zero crossing detection during the first segment where high speed is desired, the switches $M_3$ and $M_4$ are kept OFF. The bandwidth of the first amplifier stage 505 is determined by the resistors $R_1$ and $R_2$ and parasitic capacitance at the output of the first stage 505.

For the zero crossing detection during the segments where low noise is necessary, the switches $M_3$ are $M_4$ are turned ON. The added capacitance from $C_1$ and $C_2$ at the outputs of the second stage 510 reduces the bandwidth, lowering the noise.

With nominally matched transistors and resistors, the detection threshold is zero. However, by varying either $R_1$ or $R_2$, the detection threshold can be varied. This is a useful feature to cancel the effect of overshoot in each segment of the ramp.

Figure 23:
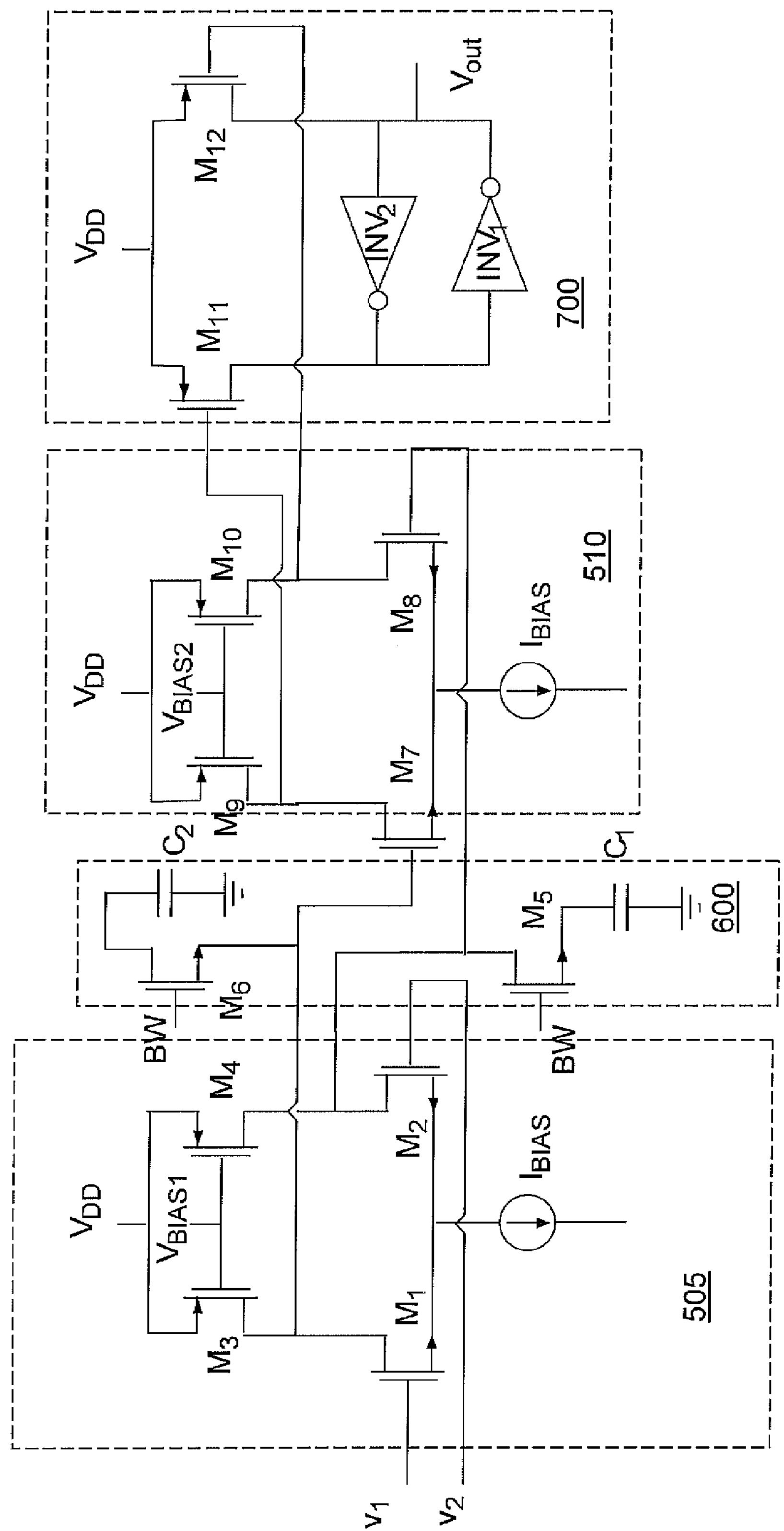
FIG. 23 illustrates another embodiment a continuous-time voltage comparator for a sample-data circuit according to the concepts of the present invention.

FIG. 23 illustrates another embodiment of a continuous-time voltage comparator to be used in the present invention. As illustrated in FIG. 23, a first amplifier stage 505 includes $M_1$, $M_2$, $M_3$, and $M_4$. A second amplifier stage 510 includes transistors $M_7$, $M_8$, $M_9$, and $M_{10}$. Bias voltages $V_{bias1}$ and $V_{bias2}$ are chosen to provide appropriate gain in the first and the second amplifier stages.

For small gain, the load transistors $M_3$, $M_4$, $M_9$, and $M_{10}$ are biased in the triode region. If a large voltage gain is desired from the first stage amplifier 505, the load transistors $M_3$ and $M_4$ can be biased in the saturation region. In such cases, the voltage $V_{bias1}$ is controlled by a common-mode feedback circuit.

It is noted that a clamping circuit, which limits the output voltage swing, can be utilized to shorten the delay in the amplifier stages.

Since the effect of the noise from the second amplifier stage 510 is reduced by the voltage gain of the first stage 505, the second stage bias current $I_{bias2}$ can be made lower than the first stage bias current $I_{bias1}$ in order to reduce power consumption.

As illustrated in FIG. 23, a latch includes transistors $M_{11}$ and $M_{12}$ and inverters $Inv_1$ and $Inv_2$. A bandwidth select circuit includes switches $M_5$ and $M_6$ and capacitors $C_1$ and $C_2$.

For the zero crossing detection during the first segment where high speed is desired, the switches $M_5$ are $M_6$ are kept OFF. The bandwidth of the first amplifier stage 505 is determined by bias voltages $V_{bias1}$ and parasitic capacitance at the output of the first stage.

For the zero crossing detection during the segments where low noise is necessary, the switches $M_5$ are $M_6$ are turned ON. The added capacitance from $C_1$ and $C_2$ at the outputs of the first stage reduces the bandwidth, lowering the noise. With nominally matched transistors and resistors, the detection threshold is zero. However, by varying the gate voltages on $M_3$ or $M_4$ individually, the detection threshold can be varied to cancel the effect of overshoot in each segment of the ramp.

Figure 24:
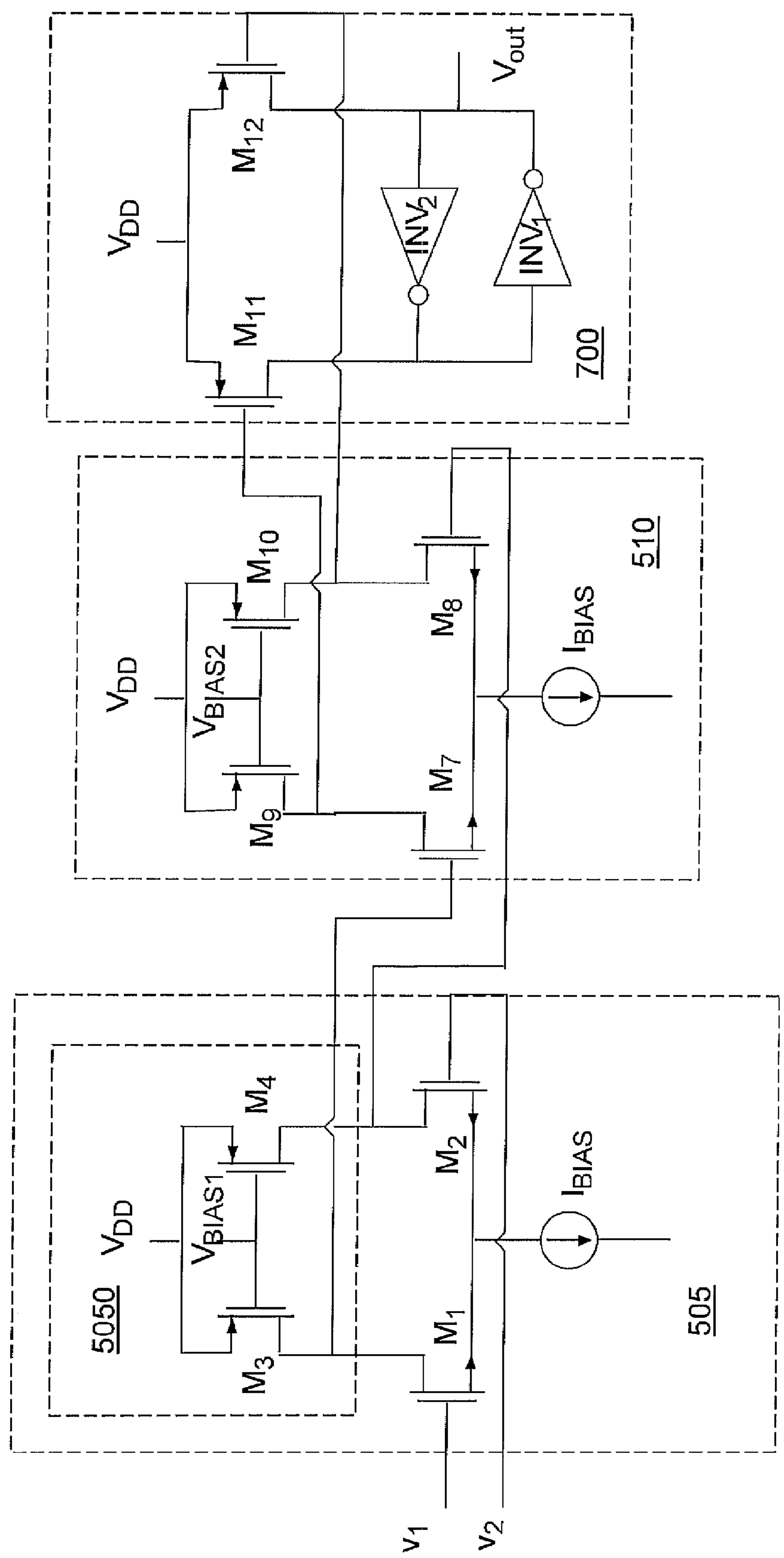
FIG. 24 illustrates another embodiment a continuous-time voltage comparator for a sample-data circuit according to the concepts of the present invention.

FIG. 24 illustrates another embodiment of a continuous-time voltage comparator to be used in the present invention. As illustrated in FIG. 24, a first amplifier stage 505 includes transistors $M_1$, $M_2$, $M_3$, and $M_4$. A second amplifier stage 510 includes transistors $M_7$, $M_8$, $M_9$, and $M_{10}$.

It is noted that a clamping circuit, which limits the output voltage swing, can be utilized to shorten the delay in the amplifier stages.

Bias voltages $V_{bias1}$ and $V_{bias2}$ are controlled together with transistor sizes and bias currents for appropriate gain and bandwidth in the first and the second amplifier stages. For small gain and large bandwidth, the load transistors $M_3$, $M_4$, $M_9$, and $M_{10}$ are biased in the triode region.

Bandwidth can be reduced and gain made larger by raising one or both of the bias voltages. Alternatively, bandwidth can be reduced and gain made larger by making bias current $I_{bias1}$ lower. If larger voltage gain and correspondingly low bandwidth is desired, the load transistors $M_3$ and $M_4$ can be biased in the saturation region. In such cases, the voltage $V_{bias1}$ is controlled by a common-mode feedback circuit.

With nominally matched transistors and resistors, the detection threshold is zero. However, by varying the gate voltages on $M_3$ or $M_4$ individually, the detection threshold can be varied to cancel the effect of overshoot in each segment of the ramp.

Figure 25:
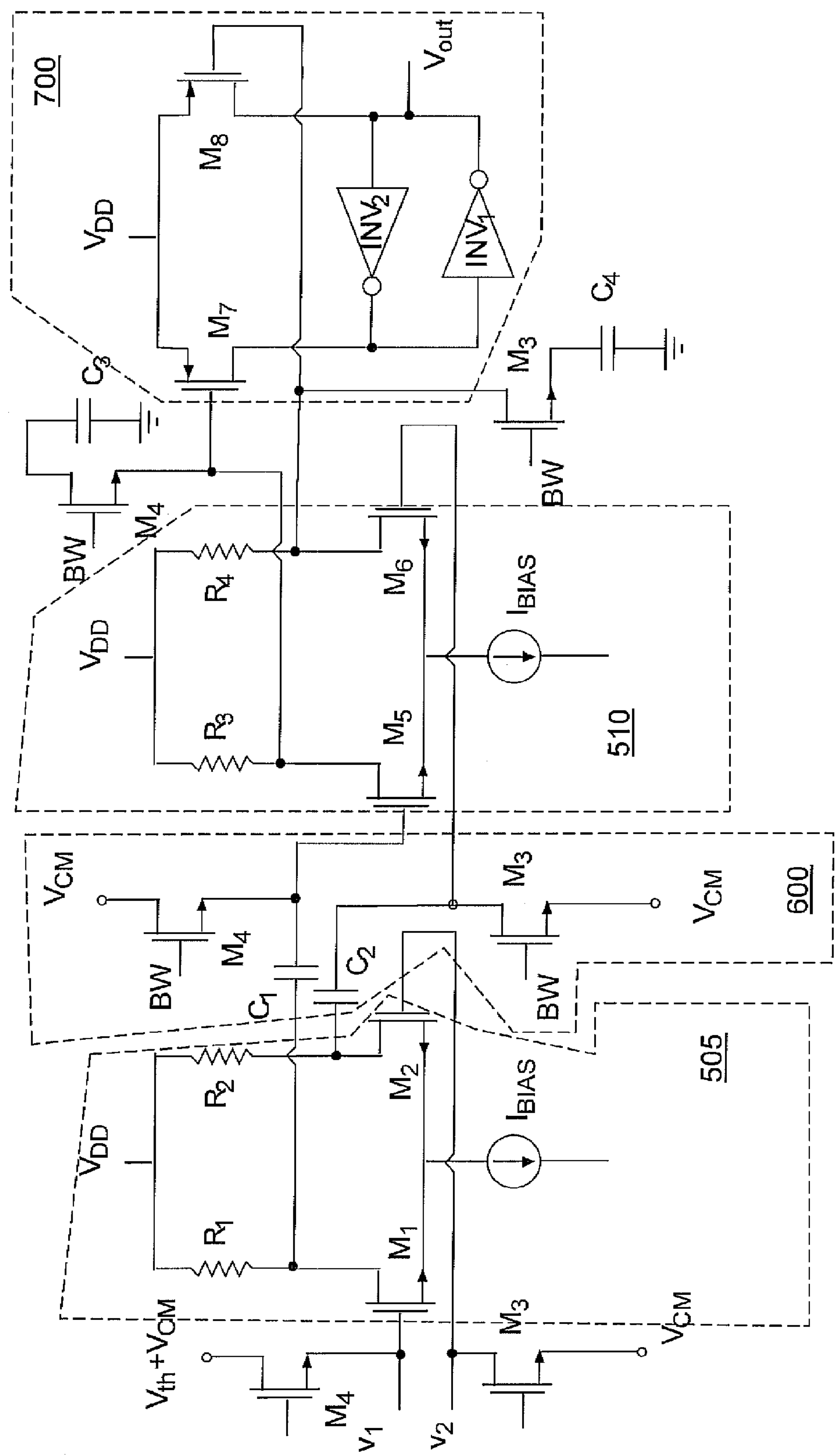
FIG. 25 illustrates another embodiment a continuous-time voltage comparator for a sample-data circuit according to the concepts of the present invention.

FIG. 25 illustrates another embodiment of a continuous-time voltage comparator with offset cancellation to be used in the present invention. As illustrated in FIG. 25, a first amplifier stage 505 includes transistors $M_1$ and $M_2$ and resistors $R_1$ and $R_2$. A second amplifier stage 510 includes transistors $M_5$ and $M_6$ and resistors $R_3$ and $R_4$.

It is noted that a clamping circuit, which limits the output voltage swing, can be utilized to shorten the delay in the amplifier stages.

Since the effect of the noise from the second amplifier stage 510 is reduced by the voltage gain of the first stage 505, a second stage bias current $I_{bias2}$ can be made lower than a first stage bias current $I_{bias1}$ in order to reduce power consumption.

As illustrated in FIG. 25, a latch includes transistors $M_7$ and $M_8$ and inverters $Inv_1$ and $Inv_2$. A bandwidth select circuits include switches $M_3$ and $M_4$ and capacitors $C_1$ and $C_2$.

During the offset cancellation phase, switches $M_3$ and $M_4$ are closed so that the system common-mode voltage $V_{CM}$ can be applied to inputs, $v_1$ and $v_2$, and the desired threshold $V_{th}$ is added to the upper input $v_1$. The offset of the first stage amplifier 505 plus the desired threshold $V_{th}$ is amplified and output from the first stage 505. This voltage is differentially sampled on capacitors $C_1$ and $C_2$.

Next, switches $M_3$ and $M_4$ are opened, and the comparator operates normally. The voltage sampled on $C_1$ and $C_2$ counteracts with the offset in the first amplified stage canceling the effect and provides accurate detection threshold of $V_{th}$.

Figure 26:
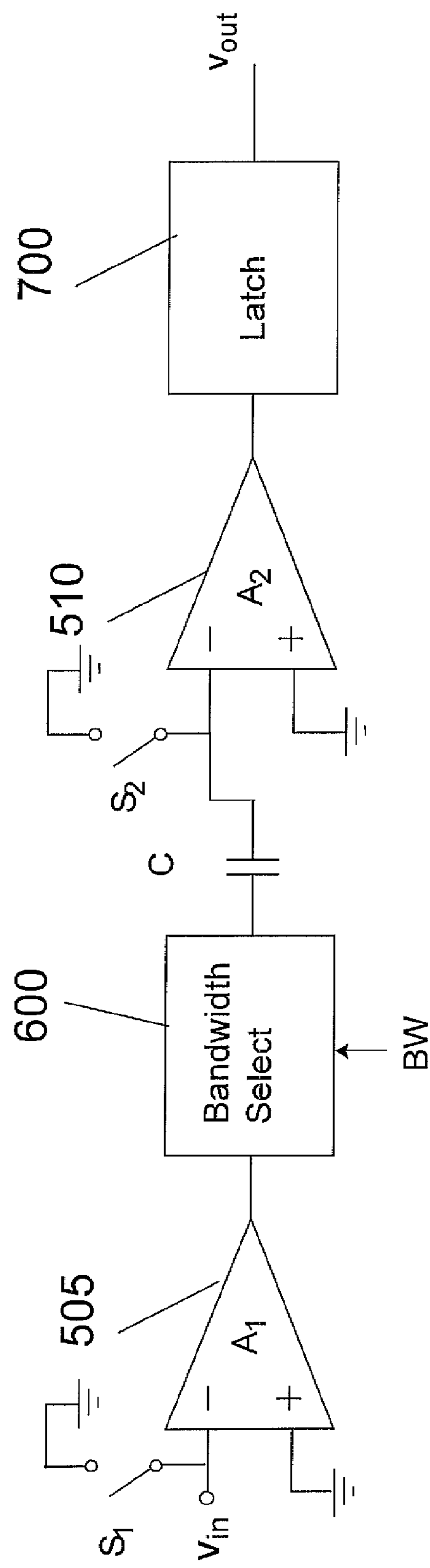
FIG. 26 illustrates another embodiment a continuous-time voltage comparator for a sample-data circuit according to the concepts of the present invention.

FIG. 26 illustrates another embodiment of a continuous-time voltage comparator with offset cancellation to be used in the present invention. As illustrated in FIG. 26, an offset cancellation is included to cancel the offset voltage due to device mismatches in the first stage amplifier.

It is noted that similar offset cancellation method can be applied to other amplifier stages if greater precision is desired.

FIG. 26 illustrates an open loop offset cancellation method; however, it is noted that other methods of offset cancellation can be utilized During the offset cancellation phase, switches $S_1$ and $S_2$ are closed so that the inputs to the amplifiers 505 and 510 are pulled to ground. The offset of the first stage amplifier 505 is amplified and shows up at the output of the first stage. This voltage is sampled on a capacitor C. Next, switches $S_1$ and $S_2$ are opened, and the comparator operates normally. The voltage sampled on C counteracts with the offset in the first amplified stage canceling the effect of the offset.

Figure 27:
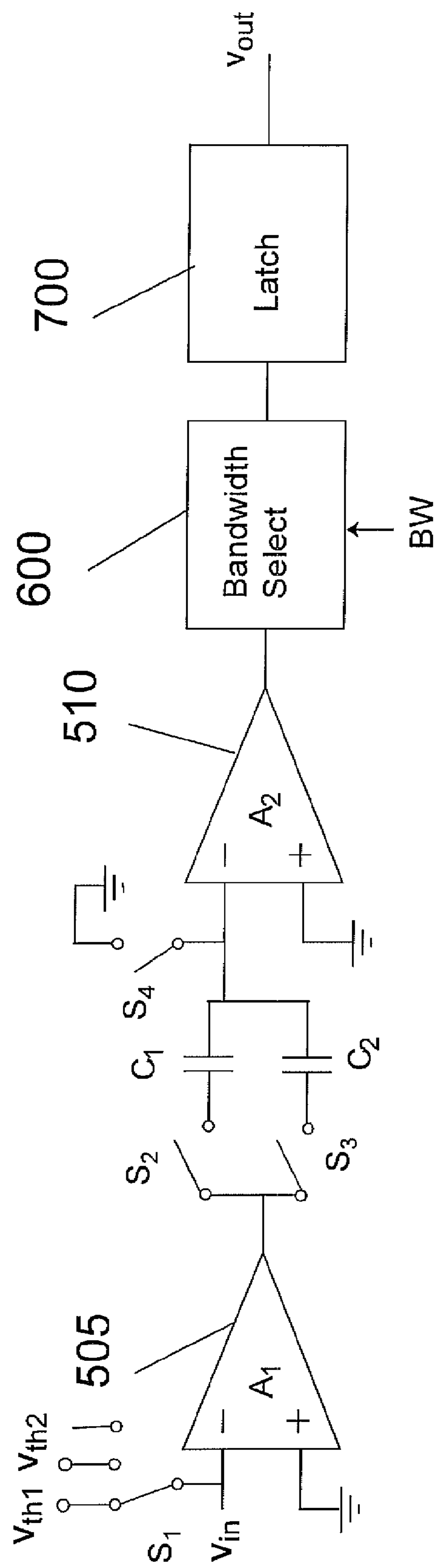
FIG. 27 illustrates another embodiment a continuous-time voltage comparator for a sample-data circuit according to the concepts of the present invention.

FIG. 27 illustrates another embodiment of a zero crossing detector. As illustrated in FIG. 27, a zero crossing detector includes plurality of threshold voltages. The circuit in FIG. 27 provides two different detection thresholds although more thresholds can be introduced as desired.

A first voltage $V_{th1}$ is first applied to the input of the first stage amplifier 505 by throwing the switch $S_1$ to a first position. Switches $S_2$ and $S_4$ are closed to sample the output voltage of the first stage amplifier 505. The switch $S_4$ is first opened, and then $S_2$ is opened.

Next, a second voltage $V_{th2}$ is first applied to the input of the first stage amplifier 505 by throwing the switch $S_1$ to a second position. Switches $S_3$ and $S_4$ are closed to sample the output voltage of the first stage amplifier 505. The switch $S_4$ is first opened, and then $S_3$ is opened.

The zero crossing detector is then operated normally by throwing the switch $S_1$ to the third (open) position. With $S_2$ closed, the first detection threshold $V_{th1}$ is selected, and with $S_3$ closed, the second detection threshold $V_{th2}$ is selected. Each detection threshold can be adjusted to cancel the effect of overshoot during each segment.

Figure 28:
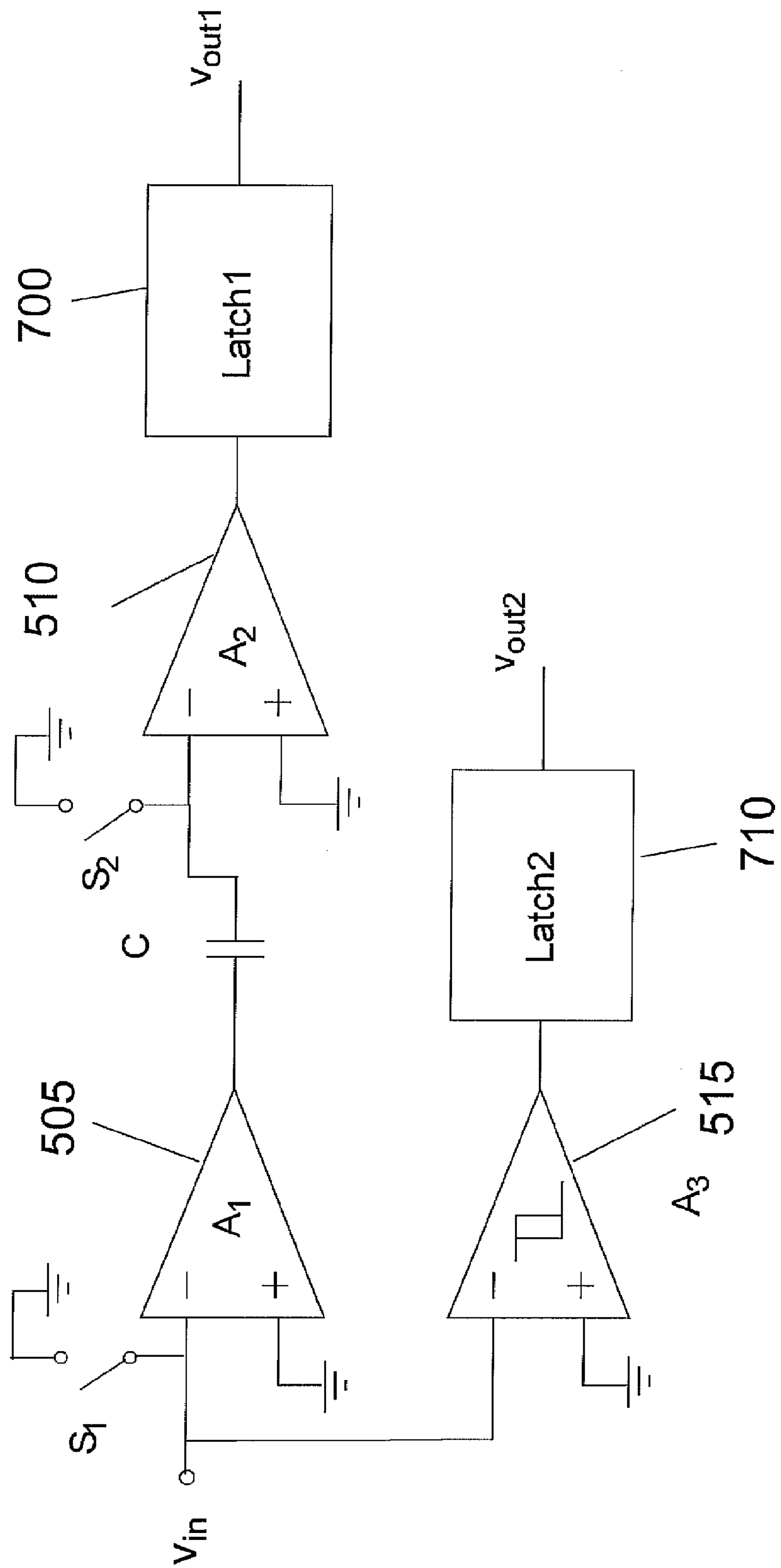
FIG. 28 illustrates another embodiment a continuous-time voltage comparator for a sample-data circuit according to the concepts of the present invention.

FIG. 28 illustrates another embodiment of a zero crossing detector. As illustrated in FIG. 28, a zero crossing detector includes a plurality of zero-crossing detectors. A first zero-crossing detector is preferably fast, but the first zero-crossing detector is not necessarily very accurate.

On the other hand, a second zero crossing detector is preferably low noise and high accuracy, but the second zero crossing detector is not necessarily fast.

The first detector is activated during the first segment, whereas the second detector is activated in the second segment. The detection threshold of each detector can be adjusted to cancel the effect of overshoot during each segment.

As illustrated in FIG. 28, the first zero crossing detector includes a first stage amplifier 505, a second stage amplifier 510, and a first latch 700. The second zero crossing detector includes a third amplifier 515 and a second latch 710.

For fast speed, the third amplifier 515 is a Schmitt trigger type with positive feedback. The detection thresholds for each zero crossing detector are optimized separately to cancel the effect of the overshoot. The bandwidth of the first detector is made lower than that of the second detector for lower noise.

As previously noted, in conventional op-amp based circuits, linearity is obtained by large open-loop gain in the op-amp. The large open-loop gain requirement in the op-amp causes conventional op-amp based circuits to be power and area inefficient. Moreover, the large open-loop gain requirement in the op-amp presents difficulty with respect to deep-submicron fabrication of conventional op-amp based circuits.

In zero-crossing based circuits, the linearity depends on the linearity of the ramp waveform. While moderate performance levels have been demonstrated from a non-linearized ramp, effective ramp linearization enables high-accuracy, high speed circuits at very low power consumption. More specifically, an approximate 1% nonlinearity is sufficient for 12 b accuracy in a typical zero-crossing based circuit up to a moderately high speed (~100 MS/s). For higher resolution or at very high speed, however, better linearity is required in the ramp.

Figure 29:
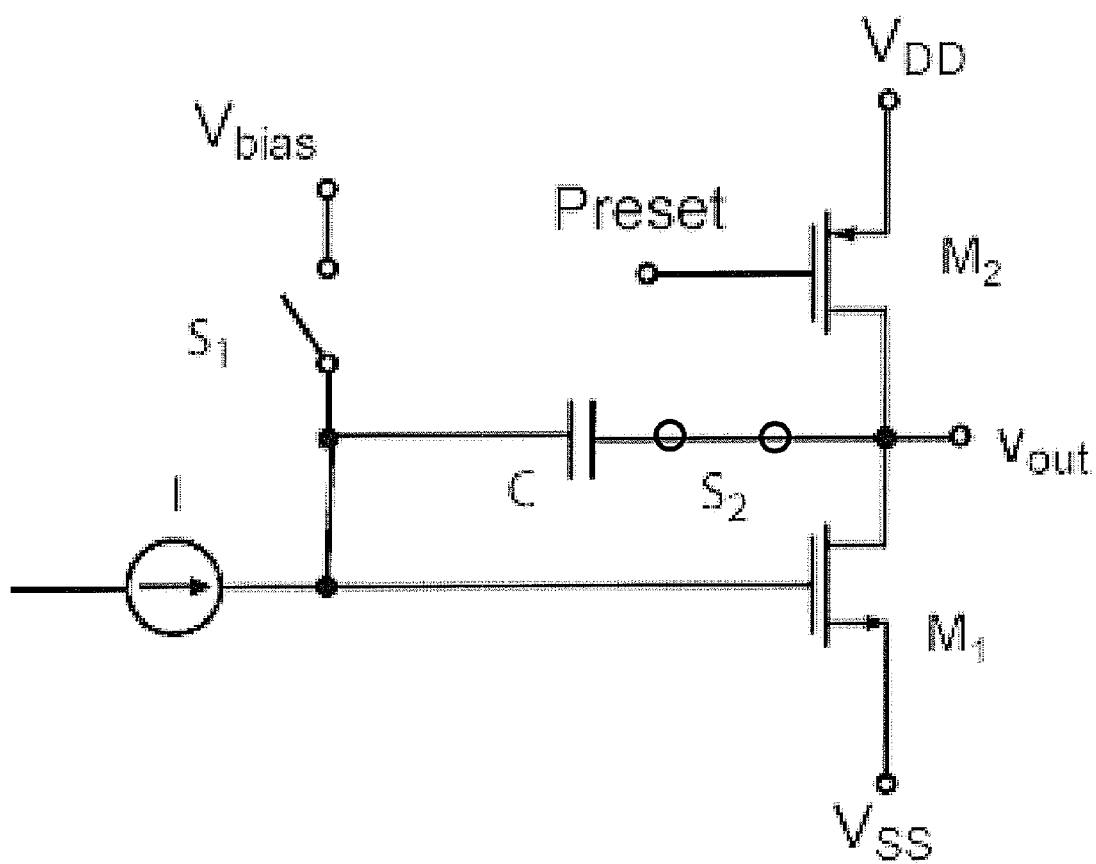
FIG. 29 illustrates a constant slope ramp circuit.

FIG. 29 illustrates an example of an embodiment of a constant slope ramp circuit. During the preset phase of the zero-crossing based circuit operation, the transistor $M_2$ is turned ON, presetting the output voltage to $V_{DD}$. As Illustrated in FIG. 29, the switch $S_1$ connects the capacitor C to a fixed voltage $V_{bias}$ in order to precharge the capacitor C to an appropriate start voltage. Any other method of initializing the voltage across the capacitor C may be used.

During the charge transfer phase, the switch $S_1$ and the switch $M_2$ are turned OFF. The transistor $M_1$ behaves as a dynamically biased common-source amplifier. If no load is present, the drain current of $M_1$ is the current I through the capacitor C. Therefore, $M_1$ behaves as a common-source amplifier with infinite load resistance whose open-loop gain is the intrinsic gain of $M_1$.

Capacitive loads normally present in zero-crossing based circuits alter the drain current through $M_1$ to $$I_{DS} = \frac{C_L + C}{C} I$$

where $C_L$ is the total effective load capacitance.

Typically, the feedback capacitor C is made much smaller than $C_L$ in order to minimize the increase in power consumption.

Since the open-loop gain of the common-source amplifier $M_1$ is reasonably high, the circuit consisting of the amplifier and the feedback capacitor C behaves as an integrator. With constant input current I, the output voltage $V_{out}$ is a ramp waveform with a constant slope.

The linearity of the ramp is improved approximately by a factor of the intrinsic gain of $M_1$. Thus, a factor of 30-50 improvement in linearity is easily realized.

As the amplifier is dynamically biased by the displacement current that already exists in the normal zero-crossing based circuit operation, it does not require additional DC bias current, thus does not increase power consumption.

Although not illustrated in FIG. 29, the ramp circuit of FIG. 29 must drive two sets of capacitors, which are reconfigured, during the subsequent sampling phase.

Figure 30:
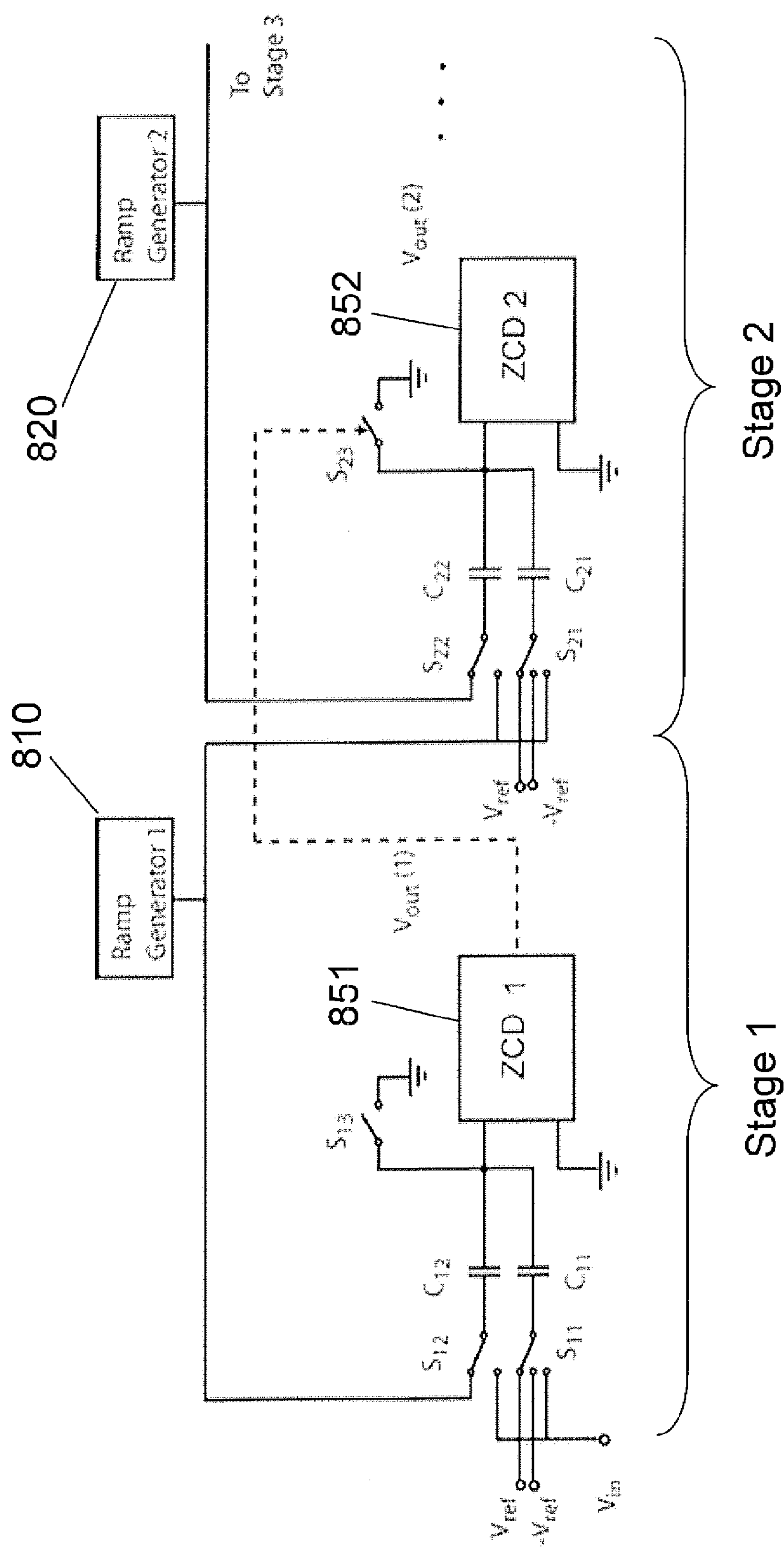
FIG. 30 illustrates an example of a 1-bit per stage pipeline analog-to-digital converter with a conventional ramp circuit.

FIG. 30 shows an example of a 1-bit per stage pipeline analog-to-digital converter with a conventional ramp circuit where the ramp circuit drives two sets of capacitors (capacitors $C_{11}$ and $C_{12}$ and capacitors $C_{21}$ and $C_{22}$). For simplicity, only the first two stages of the pipeline are shown.

Figure 31:
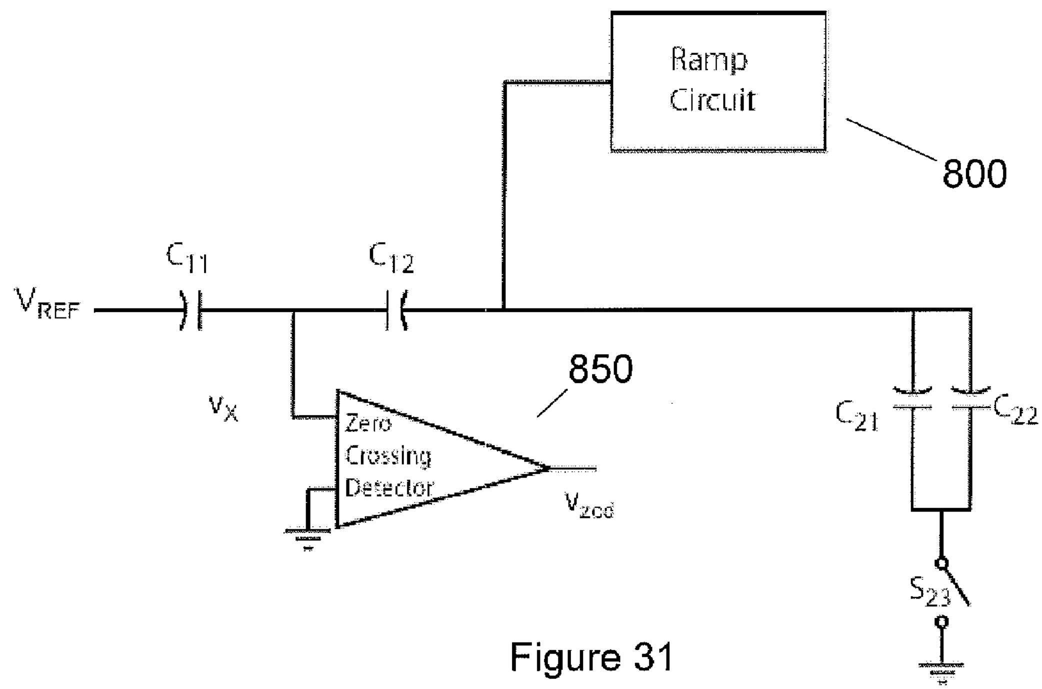
FIGS. 31 and 32 illustrate capacitor configurations of zero-crossing based circuits during a charge-transfer phase and a sampling phase, respectively.
Figure 32:
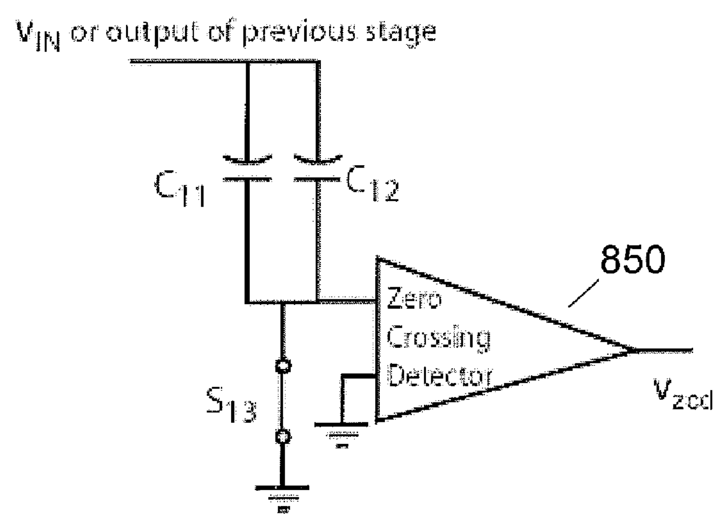

Capacitors $C_{11}$ and $C_{12}$ are first stage capacitors, and capacitors $C_{21}$ and $C_{22}$ are second stage capacitors. Switches $S_{11}$, $S_{12}$, and $S_{13}$ configure the first stage capacitors $C_{11}$ and $C_{12}$ between the charge transfer phase and the sampling phase as shown in FIGS. 31 and 32. Similarly, switches $S_{21}$, $S_{22}$, and $S_{23}$ configure the second stage capacitors $C_{21}$ and $C_{22}$.

For example, during the charge transfer phase of the first stage, as shown in FIG. 31, both switch $S_{11}$ and switch $S_{12}$ are thrown to the top position to connect the reference voltage $V_{ref}$ to capacitor $C_{11}$ and the output from ramp circuit 810 to capacitor $C_{12}$. During the sampling phase of the first stage, as shown in FIG. 32, both switch $S_{11}$ and switch $S_{12}$ are thrown to the bottom position to connect the input voltage $V_{in}$ to capacitor $C_{11}$ and capacitor $C_{12}$.

FIGS. 31 and 32 show capacitor configurations during the operation of zero-crossing based circuits wherein FIG. 31 shows a charge-transfer phase, and FIG. 32 shows a sampling phase.

As shown in FIG. 31, the ramp waveform, from ramp circuit 800, is applied to series-connected $C_{11}$ and $C_{12}$, and parallel-connected $C_{21}$ and $C_{22}$ simultaneously.

In the sampling phase, as illustrated in FIG. 32, the capacitors $C_{11}$ and $C_{12}$ are separated and reconfigured, which requires series switches $S_{12}$, $S_{21}$, and $S_{22}$, as shown in FIG. 30, between the capacitors $C_{12}$, $C_{21}$, and $C_{22}$ and the ramp circuit 800 of FIG. 30. The finite ON-resistance of the series switches $S_{12}$, $S_{21}$, and $S_{22}$ can cause nonlinearity in the resulting zero-crossing based circuits.

Figure 33:
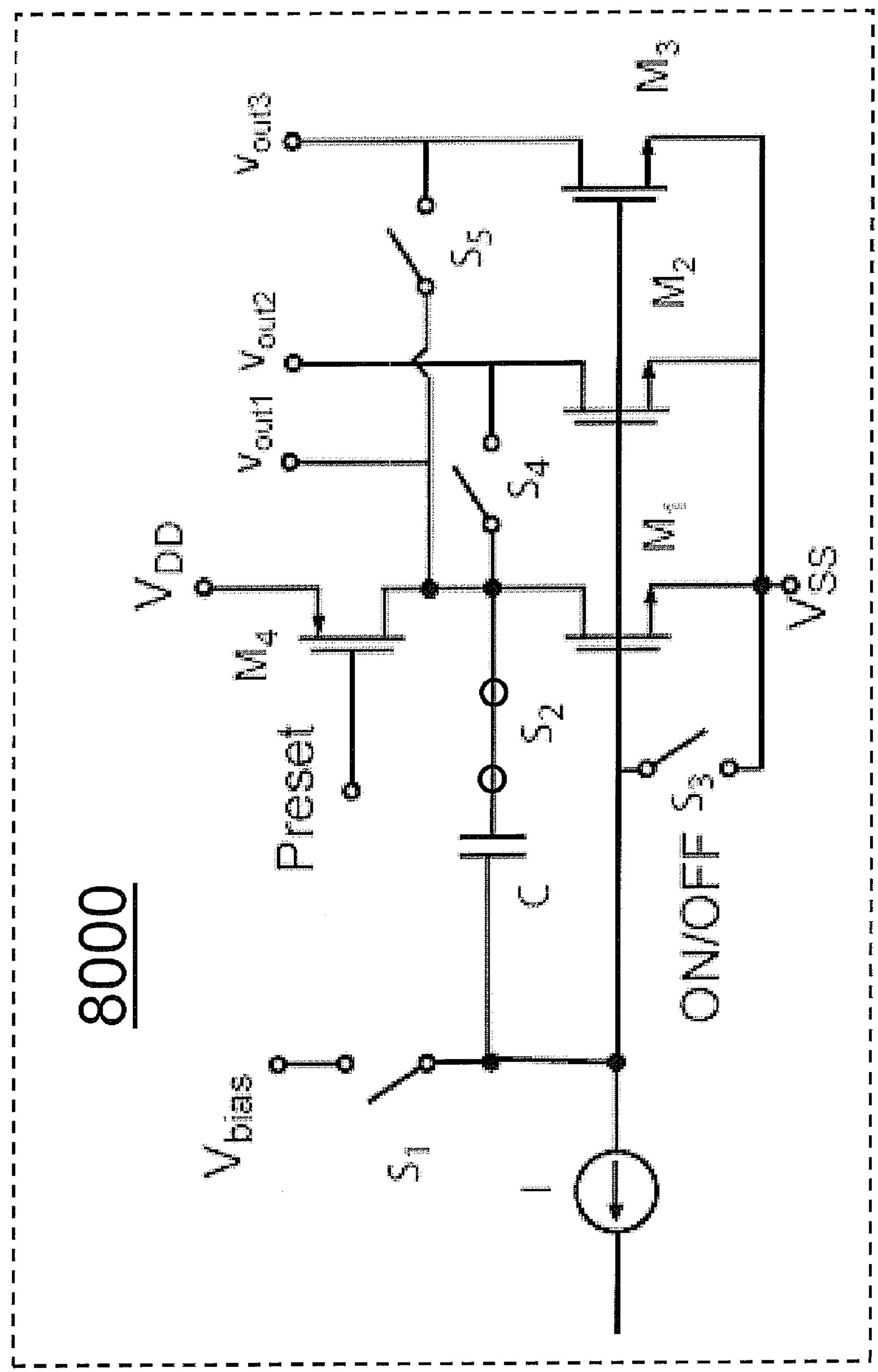
FIG. 33 illustrates a constant slope ramp circuit with multiple outputs.

In another embodiment, as illustrated in FIG. 33, the ramp circuit 8000 has multiple outputs ($V_{out1}$, $V_{out2}$, and $V_{out3}$), thereby eliminating the need for the series switches $S_{12}$, $S_{21}$, and $S_{22}$ of FIG. 30 and the associated nonlinearity.

In the ramp circuit 8000 of FIG. 33, the series-connected capacitors $C_{11}$ and $C_{12}$ of FIG. 30 are driven by the output $V_{out1}$, while the parallel connected capacitors $C_{21}$ and $C_{22}$ are driven by separate outputs $V_{out2}$ and $V_{out3}$. The transistors ($M_1$, $M_2$, and $M_3$) are scaled according to their load capacitance.

The outputs $V_{out1}$, $V_{out2}$, and $V_{out3}$ are nominally identical ramps. Any mismatch between outputs $V_{out1}$, $V_{out2}$, and $V_{out3}$ due to transistor/capacitor mismatch is equalized by the shorting switches $S_4$ and $S_5$.

The multiple output ramp circuit in FIG. 33 allows direct connection of capacitors to respective outputs $V_{out1}$, $V_{out2}$, and $V_{out3}$ without requiring series switches.

During the sampling phase, the outputs of the ramp circuit 8000 are tri-stated, by turning OFF transistors $M_2$ and $M_3$, permitting reconfiguration of the capacitors as necessary for that phase.

Figure 34:
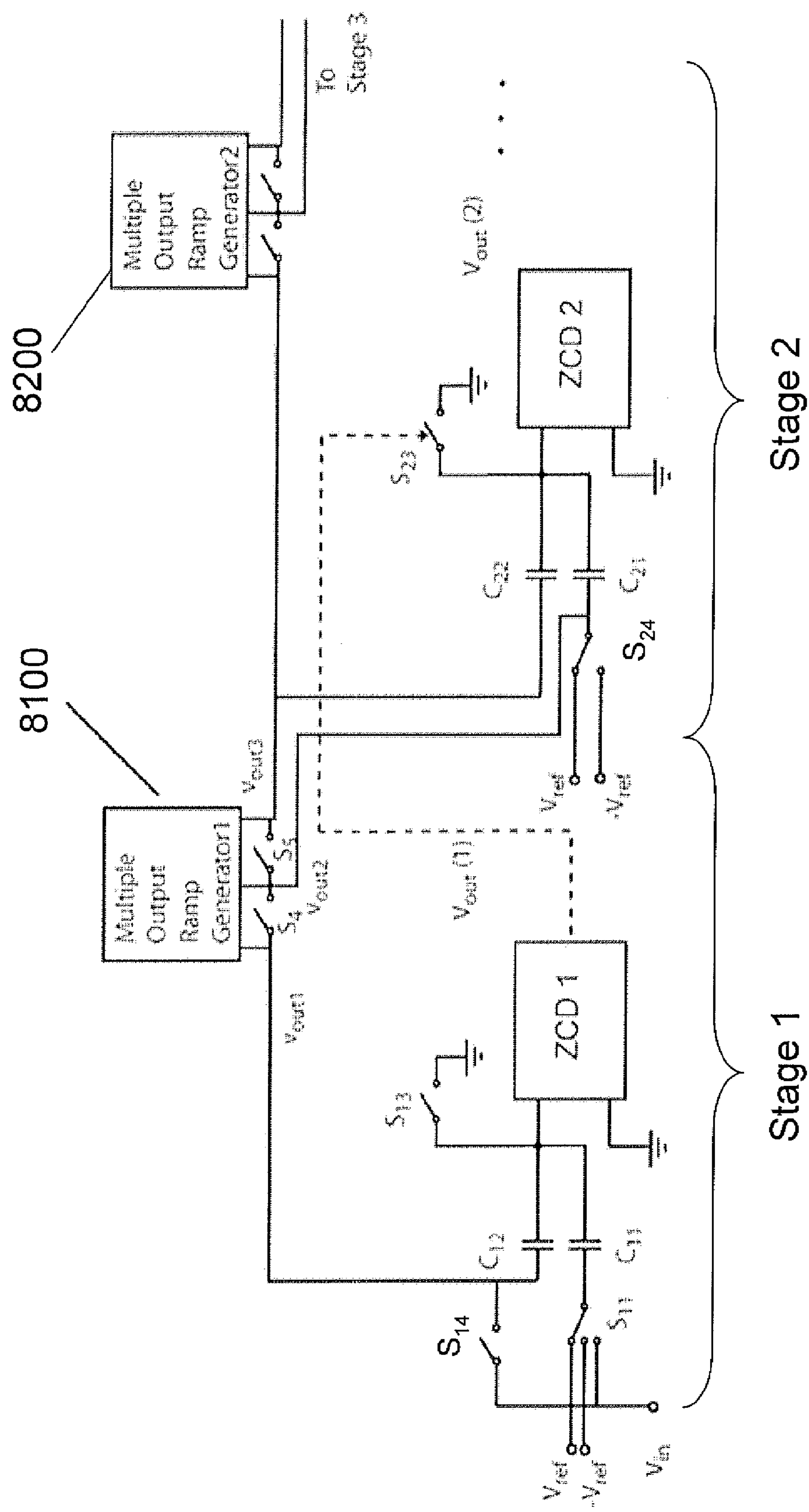
FIG. 34 illustrates an example of a 1-bit per stage pipeline analog-to-digital converter with a multiple output ramp circuit.

FIG. 34 illustrates an example of a 1-bit per stage pipeline analog-to-digital converter with multiple output ramp circuits (8100 and 8200). For clarity of illustration, the shorting switches $S_4$ and $S_5$ are shown outside the ramp circuit 8100. It is noted that these shorting switches $S_4$ and $S_5$ may be components of the ramp circuit 8100.

The capacitors $C_{12}$, $C_{21}$, and $C_{22}$ and the outputs $V_{out1}$, $V_{out2}$, and $V_{out3}$ of the ramp circuit 8100 are directly connected without series switches $S_{12}$, $S_{21}$, and $S_{22}$ of FIG. 30. The outputs $V_{out1}$, $V_{out2}$, and $V_{out3}$ are nominally identical ramps. Any mismatch between outputs $V_{out1}$, $V_{out2}$, and $V_{out3}$ due to transistor/capacitor mismatch is equalized by the shorting switches $S_4$ and $S_5$.

With respect to FIG. 34, during the charge transfer phase of the first stage, switch $S_{11}$ is thrown to connect the reference voltage $V_{ref}$ to capacitor $C_{11}$, and switch $S_{14}$ is opened so that the output from ramp circuit 8100 is connected to capacitor $C_{12}$. Moreover, during the charge transfer phase of the second stage, switch $S_{24}$ is thrown to connect the reference voltage $V_{ref}$ to capacitor $C_{21}$, and the output $V_{out1}$ from ramp circuit 8200 is connected to capacitor $C_{22}$.

Again with respect to FIG. 34, during the sampling phase of the first stage both switch $S_{11}$ and switch $S_{14}$ are thrown to connect the input voltage $V_{in}$ to capacitor $C_{11}$ and capacitor $C_{12}$. Furthermore, during the sampling phase of the second stage the outputs of the ramp circuit 8200 are tri-stated.

In summary, a switched capacitor circuit may include a level-crossing detector to generate a level-crossing detection signal when an input signal crosses a predetermined voltage level; a first stage set of capacitors operatively coupled to the level-crossing detector; a ramp circuit operatively coupled to the first stage set of capacitors; and a second stage set of capacitors operatively coupled to the first stage set of capacitors and the ramp circuit.

The ramp circuit may include multiple outputs, a first output being connected to one of the first stage set of capacitors during a charge-transfer phase and a second output being connected to one of the second stage set of capacitors during the charge-transfer phase. The multiple outputs of the ramp circuit may be tri-stated during a sampling phase.

The ramp circuit may include a variable current source, a voltage bias source, and/or a set of shorting switches.

A switched capacitor circuit may include a level-crossing detector to generate a level-crossing detection signal when an input signal crosses a predetermined voltage level; a first stage set of capacitors operatively coupled to the level-crossing detector; a first ramp circuit operatively coupled to the first stage set of capacitors; a second stage set of capacitors operatively coupled to the first stage set of capacitors and the ramp circuit; and a second ramp circuit operatively coupled to the second stage set of capacitors. The first ramp circuit is connected to one of the first stage set of capacitors during a charge-transfer phase. The second ramp circuit is connected to one of the second stage set of capacitors during the charge-transfer phase. The first ramp circuit is connected to one of the second stage set of capacitors during a sampling phase.

The ramp circuit may include a variable current source, a voltage bias source, and/or a set of shorting switches.

A multiple output constant slope ramp circuit may include a variable current source; first, second, and third transistors, operatively connected to the variable current source wherein the first transistor provides a first output voltage, the second transistor provides a second output voltage, and the third transistor provides a third output voltage. The multiple output constant slope ramp circuit may further include a capacitor operatively connected to the first transistor and the variable current source; a first shorting switch operatively connected between the first transistor and the second transistor; and a second shorting switch operatively connected between the second transistor and the third transistor.

The multiple output constant slope ramp circuit may also include a voltage bias source; a switch operatively connected between the voltage bias source and the capacitor; a voltage source; and/or a fourth transistor operatively connected between the voltage source and the first transistor.

While various examples and embodiments have been shown and described, it will be appreciated by those skilled in the art that the spirit and scope of the concepts discussed above are not limited to the specific description and drawings herein, but extend to various modifications and changes.

What is claimed is:

1. A multiple output constant slope ramp circuit, comprising:

a current source;

first and second transistors, operatively coupled to said current source; said first transistor providing a first output voltage comprising a first constant slope segment; said second transistor providing a second output voltage comprising a second constant slope segment, wherein the first constant slope segment differs from the second constant slope segment;

a capacitor operatively coupled to said first transistor and said current source; and a first shorting switch operatively coupled between said first transistor and said second transistor.

2. The multiple output constant slope ramp circuit as claimed in claim 1, further comprising:

a third transistor providing a third output voltage, and a second shorting switch operatively coupled between said first transistor and said third transistor.

3. The multiple output constant slope ramp circuit as claimed in claim 1, further comprising:

a voltage bias source; and a switch operatively coupled between said voltage bias source and said capacitor.

4. The multiple output constant slope ramp circuit as claimed in claim 2, further comprising: a voltage bias source; and a switch operatively coupled between said voltage bias source and said capacitor.

5. The multiple output constant slope ramp circuit as claimed in claim 1, further comprising:

a disconnect switch coupled between said first transistor and said capacitor to disconnect said capacitor during a sampling phase.

* * * * *